US009188109B2

(12) United States Patent
Lazaris

(10) Patent No.: US 9,188,109 B2
(45) Date of Patent: Nov. 17, 2015

(54) VIRTUALIZATION, OPTIMIZATION AND ADAPTATION OF DYNAMIC DEMAND RESPONSE IN A RENEWABLE ENERGY-BASED ELECTRICITY GRID INFRASTRUCTURE

(71) Applicant: Spyros James Lazaris, Upland, CA (US)

(72) Inventor: Spyros James Lazaris, Upland, CA (US)

( * ) Notice: Subject to any disclaimer, the term of this patent is extended or adjusted under 35 U.S.C. 154(b) by 560 days.

(21) Appl. No.: 13/731,024

(22) Filed: Dec. 30, 2012

(65) Prior Publication Data

US 2013/0218548 A1    Aug. 22, 2013

Related U.S. Application Data

(63) Continuation of application No. 13/398,735, filed on Feb. 16, 2012, now abandoned, and a continuation of application No. 13/398,738, filed on Feb. 16, 2012, now abandoned, and a continuation of application No. 13/398,744, filed on Feb. 16, 2012, now Pat. No. 8,918,225.

(51) Int. Cl.
*G06F 17/50*    (2006.01)
*F03G 6/00*    (2006.01)
(Continued)

(52) U.S. Cl.
CPC    *F03G 6/00* (2013.01); *G05B 19/02* (2013.01); *G06F 17/5009* (2013.01); *G06Q 30/0605* (2013.01); *G06Q 50/06* (2013.01); *H02J 3/382* (2013.01); *H02J 3/383* (2013.01); *H02J 3/386* (2013.01); *H02J 13/0096* (2013.01); *Y02E 10/46* (2013.01); *Y02E 10/563* (2013.01);
(Continued)

(58) Field of Classification Search
CPC ......... F03G 6/00; H02J 3/382; H02J 13/0096; H02J 3/383; H02J 3/386; G06F 17/5009; G05B 19/02; G06Q 50/06; G06Q 30/0605; Y02E 40/72; Y02E 60/74; Y02E 10/46; Y02E 10/763; Y04S 50/00; Y04S 50/10; Y04S 10/60; Y04S 10/30
See application file for complete search history.

(56) References Cited

U.S. PATENT DOCUMENTS

| | | | |
|---|---|---|---|
| 2005/0127680 A1* | 6/2005 | Lof | F03D 7/0284 290/44 |
| 2005/0165511 A1* | 7/2005 | Fairlie | F17D 1/04 700/286 |
| 2006/0055175 A1 | 3/2006 | Grinblat | |

(Continued)

FOREIGN PATENT DOCUMENTS

| | | |
|---|---|---|
| CN | 102182635 A | 9/2011 |
| GB | 2459441 A | 10/2009 |

(Continued)

*Primary Examiner* — Ramesh Patel
(74) *Attorney, Agent, or Firm* — Lazaris IP

(57) ABSTRACT

In a renewable energy-based electricity grid infrastructure, distributed data analytics enable modeling and delivery of an appropriate, time-sensitive, dynamic demand response from multiple renewable energy resource components to an intelligent power distribution network. Distributed data analytics also enable the electricity grid infrastructure to virtually, optimally and adaptively make decisions about power production, distribution, and consumption so that a demand response is a dynamic reaction across the electricity grid infrastructure in a distributed energy generation from multiple renewable energy resources responsive to various types of grid demand situations, such as customer demand, direct current-specific demand, and security issues, and so that power production is substantially balanced with power consumption.

20 Claims, 10 Drawing Sheets

(51) Int. Cl.
*G06Q 30/06* (2012.01)
*H02J 3/38* (2006.01)
*H02J 13/00* (2006.01)
*G06Q 50/06* (2012.01)
*G05B 19/02* (2006.01)

(52) U.S. Cl.
CPC .............. *Y02E 10/763* (2013.01); *Y02E 40/72* (2013.01); *Y02E 60/74* (2013.01); *Y04S 10/123* (2013.01); *Y04S 10/30* (2013.01); *Y04S 10/60* (2013.01); *Y04S 50/00* (2013.01); *Y04S 50/10* (2013.01)

(56) References Cited

U.S. PATENT DOCUMENTS

| | | | | |
|---|---|---|---|---|
| 2006/0276938 A1* | 12/2006 | Miller | ............. | G06Q 50/06 700/295 |
| 2008/0052145 A1* | 2/2008 | Kaplan | ............. | G06Q 10/0631 705/7.12 |
| 2009/0063680 A1* | 3/2009 | Bridges | ............. | B60L 11/1824 709/224 |
| 2010/0138363 A1* | 6/2010 | Batterberry | ............. | G06Q 10/04 705/412 |
| 2011/0046792 A1* | 2/2011 | Imes | ............. | F24F 11/0086 700/278 |
| 2011/0106328 A1* | 5/2011 | Zhou | ............. | G05B 13/024 700/291 |
| 2011/0208637 A1 | 8/2011 | Wakita et al. | | |
| 2011/0307109 A1 | 12/2011 | Sri-Jayantha | | |
| 2012/0029720 A1* | 2/2012 | Cherian | ............. | G06Q 10/06 700/297 |
| 2012/0130556 A1* | 5/2012 | Marhoefer | ............. | H02J 3/32 700/291 |
| 2012/0150359 A1* | 6/2012 | Westergaard | ............. | H02J 3/14 700/291 |
| 2012/0316697 A1* | 12/2012 | Boardman | ............. | H02J 13/0079 700/297 |

FOREIGN PATENT DOCUMENTS

| | | |
|---|---|---|
| RU | 2153752 C1 | 7/2000 |
| WO | WO 01/52379 A2 | 7/2001 |
| WO | WO 2009/016038 A2 | 2/2009 |

\* cited by examiner

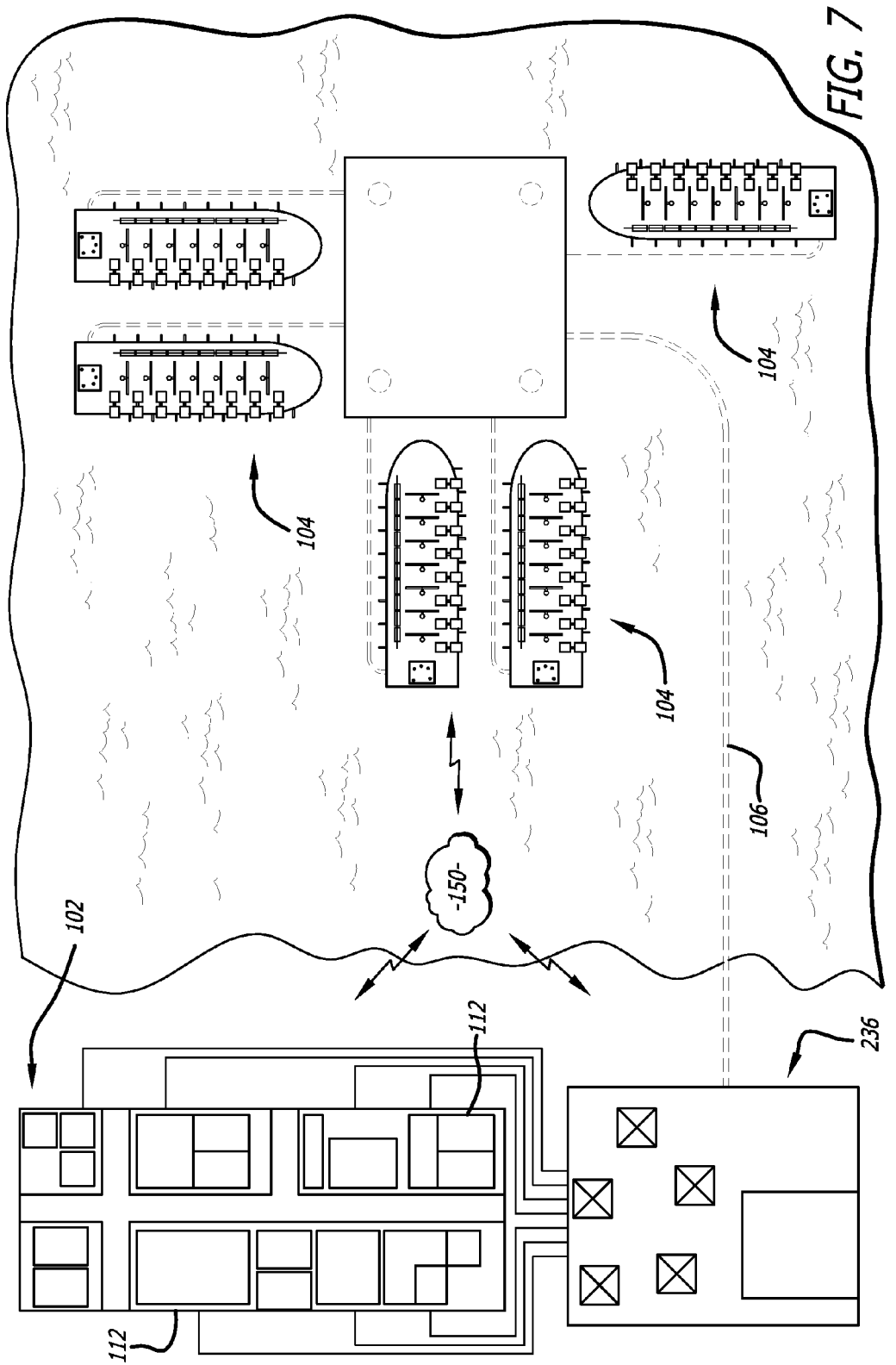

VIRTUALIZATION, OPTIMIZATION AND ADAPTATION OF DYNAMIC DEMAND RESPONSE IN A RENEWABLE ENERGY-BASED ELECTRICITY GRID INFRASTRUCTURE

CROSS REFERENCE TO RELATED PATENT APPLICATIONS

To the fullest extent provided by law, the present non-provisional patent application is a continuation of, and claims priority to and the full benefit of the following U.S. non-provisional utility patent application Ser. No. 13/398,735, filed Feb. 16, 2012; Ser. No. 13/398,738, filed Feb. 16, 2012; and Ser. No. 13/398,744, filed Feb. 16, 2012.

STATEMENT REGARDING FEDERALLY-SPONSORED RESEARCH OR DEVELOPMENT

Not applicable.

FIELD OF THE INVENTION

The present invention relates to renewable energy resources. Specifically, the present invention relates to systems, methods, and apparatuses for supplying the power needs of an intelligent electricity grid from an entirely-renewable energy resource platform.

BACKGROUND OF THE INVENTION

As the interest in power generated from renewable energy resources rapidly increases, increasing attention is being focused systems and methods in which such power is produced, transmitted, delivered, and consumed. Despite technological advances in developing renewable energy resources and in electricity grids, current energy infrastructure suffers from many limitations that need rapid improvement as demand for such power increases, and grid security importance and regulatory requirements for use of "green" resources become more prominent.

Power derived from renewable energy such as solar, wind, wave, and solar thermal resources are becoming increasingly relied upon, but each includes several limitations that impede them from becoming widespread, low-cost, efficient, and continually viable sources of electricity. Each is inherently unreliable, owing to factors such as changes in the time of day and variations in weather conditions that mean that maximized performance of components for each resource is very difficult to manage. Combining any of these together proves even more difficult to manage the inherent inefficiencies involved in operating devices and components to meet energy demand.

Power derived from renewable energy sources is generated both on land and at sea. Offshore energy installations present many complicated challenges. The majority of all offshore energy installations are primarily devoted to carbon-based, non-renewable resources, but each of solar power, wind power, wave, and solar thermal-based power can be and are generated from offshore installations. However, implementing offshore installations are extremely challenging, time-consuming, expensive, and environmentally sensitive. Many issues must addressed by the energy provider wishing to use an offshore base for generating power of any kind. Just a few examples of issues that present significant challenges include storage of power, its transmission to the onshore power grid, providing power to the offshore installation itself, maintenance, distance from the electricity grid, and exposure to weather elements. Additionally, building a large-scale multi-resource platform or installation is very expensive and often has a large environmental impact footprint, making such an installation a questionable investment. All of these issues can reduce the attractiveness of constructing and operating such an installation.

Storage issues are a particularly challenging problem attendant to transferring power generated offshore to the onshore electricity grid. The electricity grid itself contains limited inherent facility for storing electrical energy. Power must be generated constantly to meet uncertain demand, which often results in over-generation (and hence wasted energy) and sometimes results in under-generation (and hence power failures). Additionally, there is limited facility for storing electrical energy at the point of generation, particularly in the case of offshore installations where available space must be maximized and cost and environmental issues are major considerations.

Nonetheless, requirements for buying power generated from "clean" or "green" renewable resources are rapidly increasing. Enhanced ecological and environmental awareness, and a desire to reduce energy dependency on carbon-based fossil fuels and to decrease availability and price concerns resulting from exposure to geopolitical concerns, has lead many governments to implement regulations that either dictate or impose limits on the amount of power produced and consumed that is generated from carbon-based or otherwise non-renewable energy sources. Because of this, there is a strong and continually developing need for efficient and cost-effective power generated from renewable energy resources.

Furthermore, despite these challenges and many others in the existing technology concerning power from renewable resources, there exists a strong need for improved systems and methods of producing, transmitting, distributing and delivering energy so that the needs of power customers can be satisfied from renewable energy sources. There is also a strong and increasing need for clean, reliable, efficient sources of power that are not dependent on geopolitical issues and which maximize the availability of renewable resources to deliver power in real-time as needed and instructed by "smart" electricity grids. There is further a need for an energy management network capable of integrating data from multiple sources that influence the amount of such power available to be generated and required for delivery to customers of electricity grids. Additionally, there exists a strong need in the art for a platform that is capable of efficiently-provided power from multiple renewable energy resources that minimize many of the challenges facing energy providers, as well as for electricity grid infrastructure that is capable of meeting electricity demand substantially from renewable energy resources, maintaining grid infrastructure integrity against increasing public security concerns, and maximizing operational efficiency and capacity to reduce the costs associated with the many inherent inefficiencies with renewable energy resources.

It is accordingly one object of the present invention to provide a renewable energy resource management system and method of managing power distribution from a renewable resource provider to an intelligent power distribution network, that addresses many of the problems and challenges facing the buyers and sellers of power derived from renewable energy resources such as wind, solar, wave, and solar thermal energy, and with generating, transmitting and distributing power to meet the capacity of a developing, sophisticated, and intelligent electricity grid infrastructure. It is a further object of the present invention to provide a multi-resource renewable energy installation and method of operation that addresses problems and challenges with generating power from renewable energy resources in an efficient and cost-effective manner to meet the substantially increasing demand, need, and requirement for power from such resources. It is yet another object of the present invention to provide an improved electricity grid infrastructure, and methods of operating and automating the same, that address the problems and challenges associated with meeting electricity demand substantially from renewable energy resources, maintaining grid infrastructure security, and maximizing operational efficiency and capacity to meet real-time power demands of grid customers.

It will be apparent to those of skill in the art that one would be not be motivated to combine existing art, and one would not consider it reasonable to try to combine existing art, to arrive at the teachings of the present invention. There are many reasons why existing technology teaches against the disclosures of the present invention. For example, there are inherent market biases favoring the use of existing, non-renewable energy resources. Existing energy production infrastructure strongly favors the use of non-renewable energy resources, and the costs of generating power from renewable energy resources are far higher, despite the availability of and ease with which wind, solar, wave, and solar thermal energy can be obtained. Additionally, energy commodity prices and weather conditions fluctuate widely, making it very difficult and often prohibitively expensive to efficiently generate, transmit, and distribute power derived from renewable energy resources. These fluctuations, and the inherent inefficiencies resulting from them in utilizing renewable resources, make it difficult for providers to justify investing in the infrastructure needed to develop, transmit, and distribute power from renewable energy resources. This includes investing in and building offshore installations, whether dedicated to a single renewable resource or hosting multiple components that generate power from several different renewable resources in the same location. It will therefore be readily apparent based on all of the above that it would not be obvious to combine any of the teachings of the prior art to arrive at the specific technological advances discussed herein.

BRIEF SUMMARY OF THE INVENTION

The present invention discloses, in one aspect thereof, an energy management system that presents an operational infrastructure for managing the generation, transmission, delivery, and distribution of power to "smart" electricity topologies derived from multiple renewable energy resources. The infrastructure is fully network-connected in a distributed computing environment, and enables utilities and providers to respond to peak demand loads more effectively and efficiently, balance power production with power consumption, and supply power consumers entirely from multiple renewable resources.

In another aspect of the present invention, a multi-resource renewable energy installation provides the ability to efficiently produce power from multiple renewable energy resources in a single location. The multi-resource renewable energy installation is a fully network-connected, distributed platform for producing power from multiple renewable energy resources and maintaining an efficient operational capacity of each such resource to transmit and deliver real-time power demands of customers that balances power production to consumption to minimize both supply and demand-side power storage requirements.

In a further aspect, the present invention discloses an innovative electricity grid infrastructure that enables robust and dynamic multi-directional communications and automated decision-making systems to provide electricity grid operators with multiple capabilities to efficiently generate, transmit, deliver and distribute power. The electricity grid infrastructure enables both supply and demand-side improvements in responding to peak demand loads, balancing and maintaining power production with power consumption to minimize grid storage requirements, re-configuring assets for power production and re-routing power for consumption as needed, and supplying power demand entirely from multiple renewable energy resources.

Together, the aspects of the present invention provide significant improvements and advances in systems and methods in which power is produced, transmitted, delivered and distributed. The present invention therefore incorporates and integrates concepts in producing power from renewable, non carbon-based energy resources, transmitting and distributing power to increasingly interconnected and intelligent electricity grids, and delivering power to end consumers, as discussed herein.

In one embodiment of the present invention, a renewable energy resource management system comprises a distributed computing infrastructure configured to integrate a plurality of modules over one or more interconnected computing networks to efficiently manage a delivery of power generated by a multi-resource offshore renewable energy installation having a plurality of renewable energy resource components and capable of generating power from multiple renewable energy resources to an intelligent power distribution network composed of a plurality of microgrids each capable of being separately decoupled from the intelligent power distribution network for distribution of power thereto, the plurality of modules at least including a power generation module, a power distribution module, a power settlement module, and a power settlement module. The power distribution module having a load control component configured to forecast a power requirement of the intelligent power distribution network over a specific period of time, based on a continuing assessment of a power demand of each power user of each microgrid in the plurality of microgrids that is communicated to the load control component and to manage a power delivery to each microgrid in the plurality of microgrids responsive to the power demand, and having a renewable energy resource pricing and conditions component to continually assess a renewable resource commodity price for each renewable energy resource of the multiple renewable energy resources over the specific period of time to forecast a variable purchase price range at which each renewable energy resource is to be purchased and to assess a renewable energy resource purchasing condition required of the intelligent power distribution network as determined by one or more of a regulatory requirement and a contractual requirement, and having a communications component configured to communicate to the power settlement module at least the power requirement of the intelligent power distribution network, the variable purchase price range at which each renewable energy resource is to be purchased, and the renewable energy resource purchasing condition.

The power generation module having a renewable resource efficiency component configured to continually assess the renewable resource commodity price for each renewable energy resource of the multiple renewable energy resources over the specific period of time to forecast a variable selling price range at which each renewable energy resource is to be sold and to generate a meteorological conditions forecast for each renewable energy resource of the multiple renewable energy resources for the specific period of time, and having a renewable resource control component configured to continually assess an operative availability and forecast an available power capacity of each renewable energy resource component at the multi-resource offshore renewable energy installation, relative to at least the variable selling price range at which each renewable energy resource is to be sold and the meteorological conditions forecast for each renewable energy resource, to meet the power requirement for the specific period of time, and a communications component configured to communicate to the power settlement module the available power capacity of each renewable energy resource component, for the specific period of time, the variable selling price range at which each renewable energy resource is to be sold, and the meteorological conditions forecast, and the power settlement module having a transaction resolution component configured to resolve a final price at which each renewable energy resource will be purchased by the intelligent power distribution network from the multi-resource offshore renewable energy installation for the specific period of time and a production, transmission, and delivery component configure to arrange a power transfer from the multi-resource offshore renewable energy installation over a high-voltage direct current transmission system for distribution by the load control component to each microgrid in the intelligent power distribution network by communicating, through a communications component, instructions to the power generation module to produce power and to the power transmission module to transmit power. the power transmission module having one or components configured to initiate the power transfer responsive to instructions from the power settlement module, operate a plurality of voltage source converters coupled to power output circuits of each renewable energy resource component that provide a substantially constant voltage level for connection to a common direct current bus in the high voltage direct current transmission system, and monitor the power output circuits and voltage source converters to ensure that the power requirement is being satisfied. The offshore multi-resource renewable energy installation including a wind component comprising at least one wind turbine, a photovoltaic component comprising at least one photovoltaic module, a hydrokinetic component comprising at least one of a surface wave turbine, an oscillating column, and an undersea wave turbine, and a solar thermal energy component comprising at least one high-temperature solar thermal collector, each of the wind component, the photovoltaic component, the hydrokinetic component, and the solar thermal energy component having a separate renewable energy resource component control system coupled thereto to independently and variably operate each of the at least one wind turbine, the at least one photovoltaic module, the at least one of a surface wave turbine, an oscillating column, and an undersea wave turbine, and the at least one high-temperature solar thermal collector responsive to instructions from the power generation module to generate a specific amount of power balanced with the power requirement of the intelligent power distribution network for the specific period of time, that maximizes an efficient operational capacity of each renewable energy resource component generating the power requirement, and minimizes both a power storage requirement at the multi-resource offshore renewable energy installation and a power storage requirement at a receiving location of the intelligent power distribution network.

In another embodiment of the present invention, a renewable energy resource management system comprises an intelligent power distribution network segregated into one or more microgrids each separately coupled to the intelligent power distribution network so that each is capable of being decoupled to provide power separately thereto as needed, and each configured to distribute power to a segment of customers of the intelligent power distribution network in response to a power requirement of each segment of customers for a specific period of time determined and communicated by a microgrid control system managing each microgrid. The embodiment also includes a load management module capable of communicating with the intelligent power distribution network and an offshore multi-resource renewable energy installation in a distributed computing infrastructure in which a transfer of power from the offshore renewable resource installation to the intelligent power distribution network that satisfies only the power requirement as needed by each microgrid and maximizes an efficient utilization of each renewable energy resource component in a plurality of renewable resource components available at the offshore multi-resource renewable energy installation is settled, so that a storage requirement of power generated at the offshore renewable energy resource installation and a storage requirement of power delivered to a receiving location prior to transmission to the intelligent power distribution network is maintained at a minimum amount, the efficient utilization of each renewable resource component determined, for the specific amount of time, by a meteorological condition forecasted for each resource at the offshore multi-resource renewable energy installation as determined by communicating with a first external network, a commodity purchase price forecasted for each resource as determined by communicating with a second external network, and a resource availability forecasted for each resource as determined by communication with a component control system managing each renewable energy resource component. The plurality of renewable resource components available at the offshore multi-resource renewable energy installation include a wind component, a photovoltaic component, a hydrokinetic component, and a solar thermal collection component, each renewable resource component operable to generate power from one or more output circuits coupled to a plurality of voltage source converters and a common direct current bus over which a combined power output that includes a rectified alternating power output portion and a direct current power output is provided for transmission to the intelligent power distribution network over a sub-sea high voltage direct current transmission link.

In another embodiment, the present invention discloses a method of managing power distribution from a renewable energy resource provider to an intelligent power distribution network. The method comprises communicating with an intelligent power distribution network to determine, over a specific period of time, a power requirement of customers represented by a plurality of microgrids each separately coupled to the intelligent power distribution network and each continuously communicating a power demand for the customers represented, and to determine a purchase price range at which the power requirement will be purchased, the price range calculated from a first commodity pricing forecast of each renewable energy resource at a multi-resource offshore renewable energy installation site, and to determine contractual and regulatory requirements of each microgrid relative to the purchase of power produced from one or more of the renewable energy resources. The method also comprises communicating with components representing each renewable energy resource at the offshore multi-resource renewable energy installation to determine, for the specific period of time, an efficient use of the components representing each renewable energy resource including a wind component, a photovoltaic component, a hydrokinetic component, and a solar thermal collection component, based upon a forecast of meteorological conditions relative to each renewable energy resource at the multi-resource offshore renewable energy installation site, a selling price range at which the power produced will be sold, the selling price range calculated from a second commodity pricing forecast of each renewable energy resource at the offshore multi-resource renewable energy installation site, and availability of power produced from one or more of the renewable energy resources based upon operating conditions at the offshore multi-resource renewable energy installation. The method also includes settling a transfer of the power requirement to the intelligent power distribution network from the multi-resource offshore renewable energy installation and instructing the multi-resource offshore renewable energy installation to produce a specific amount of power from each of the wind component, a photovoltaic component, a hydrokinetic component, and a solar thermal collection component, each component having one or more power output circuits coupled to a plurality of voltage source converters and a common direct current bus over which a combined power output that includes a rectified alternating current power output portion and a direct current power output is provided for transmission of the power requirement to the intelligent power distribution network over a high-voltage direct current transmission system.

Other embodiments, features and advantages of the present invention will become apparent from the following description of the embodiments, taken together with the accompanying drawings, which illustrate, by way of example, the principles of the invention.

BRIEF DESCRIPTION OF THE SEVERAL VIEWS OF THE DRAWINGS

The accompanying drawings, which are incorporated in and constitute a part of this specification, illustrate several embodiments of the invention and together with the description, serve to explain the principles of the invention.

FIG. 7 is a top plan view of a multi-resource offshore renewable energy installation and electricity grid infrastructure according to one embodiment of the present invention.

DETAILED DESCRIPTION OF THE INVENTION

In the following description of the present invention reference is made to the accompanying figures which form a part thereof, and in which is shown, by way of illustration, exemplary embodiments illustrating the principles of the present invention and how it is practiced. Other embodiments will be utilized to practice the present invention and structural and functional changes will be made thereto without departing from the scope of the present invention.

The present invention discloses an energy management system and method for power transmission to an intelligent electricity grid from a multi-resource renewable energy platform, an offshore multi-resource renewable energy installation and method of maximizing its operational capacity, and a renewable energy-based electricity grid infrastructure and method of its operation and automation. Each of these embodiments achieves one or more of the objectives of the present invention.

These include, but are not limited to, reducing costs of producing power from renewable energy resources; maximizing efficient operational capacity of multiple sources of power from renewable energy in the same location; adapting power production to power consumption to balance power loads and minimize or eliminate the need for large-scale, expensive power storage components; reducing dependency on non-renewable energy resources by introducing large-scale power production to meet power demands entirely from renewable resources; addressing and enhancing a growing need for power grid infrastructure security, stability, and reliability; providing power for future direct current-specific electricity grids and different sources of power to different power consumers as needed; enhancing electricity grid infrastructure automation, optimization, risk and outage management, self-checking and self-healing; and integrating distributed grid and cloud computing into the broader infrastructure for producing, transmitting, distributing, and delivery power.

The present invention also provides a framework within which a consistent flow of power can be delivered as needed while minimizing the impact of fluctuations that results in peaks and valleys. The present invention also allows power from renewable energy resources to be bought and sold at the low cost and high profit by aggregating multiple variables to make sure power-producing assets operate efficiently. Within this framework, available power-producing assets do not need to all be operated at the same time or at the same speed, and power is produced from substantially the most efficient available assets.

Figure 1:
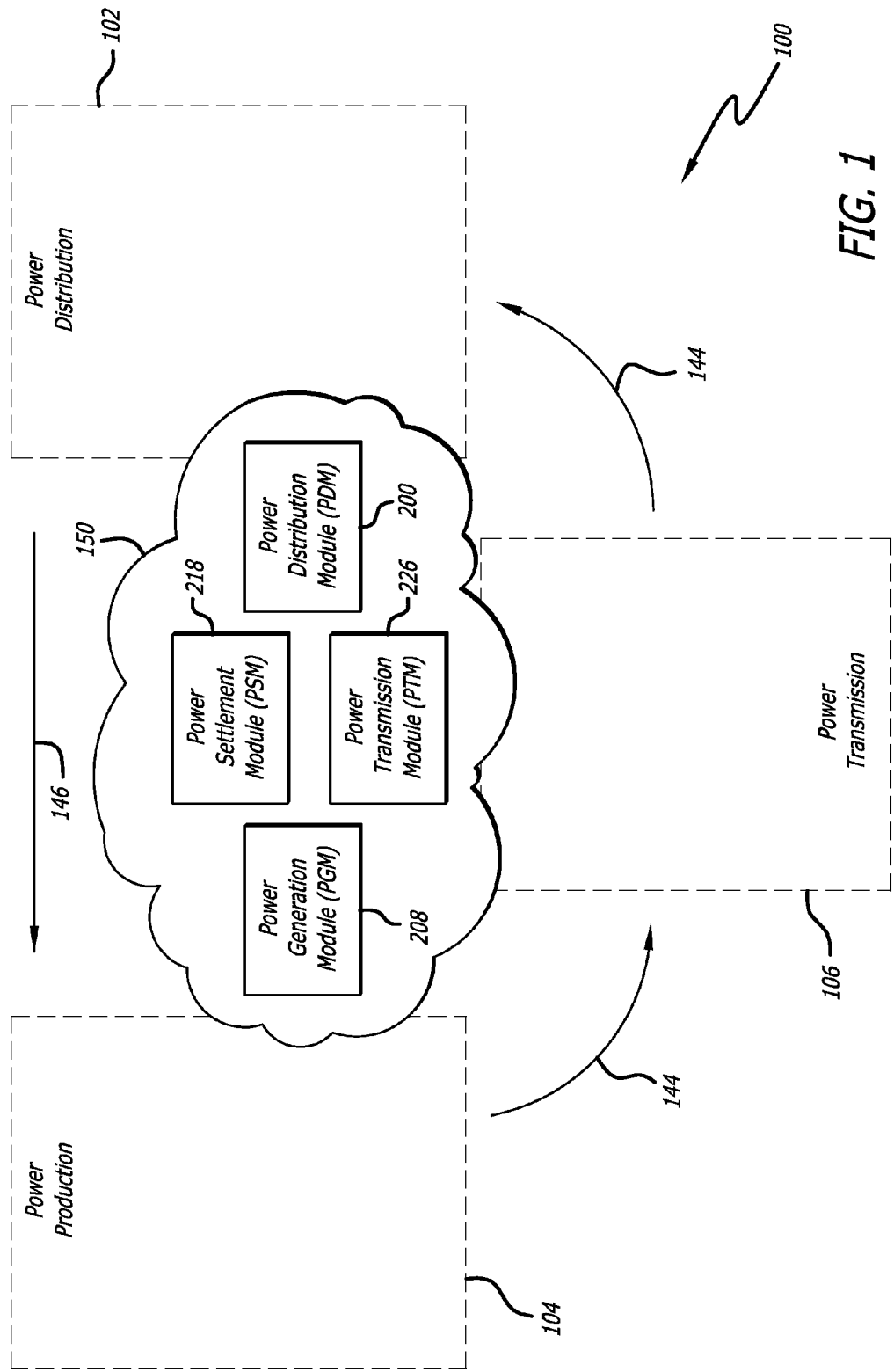
FIG. 1 is a system diagram of a renewable resource energy management system according to one embodiment of the present invention.

FIG. 1 is a system diagram of a renewable resource energy management system 100 according to one embodiment of the present invention. The renewable energy resource management system 100 is configured to, in one aspect, arrange a power transaction between a buyer and a seller of power. The "buyer" is an intelligent power distribution network 102, which may comprise a portion of one or more electricity grids, each of which is composed of a plurality of microgrids 108. Each microgrid 108 serves a plurality of power customers 112 who are at least communicatively coupled thereto. The "seller" is one or more multi-resource offshore renewable energy installations 104 at least comprising several renewable energy resource components 116 capable of generating power from multiple sources of renewable energy 114. Many multi-resource offshore renewable energy installations 104 may be coupled together and included with the scope of the present invention, so that for example ultra-large offshore energy "farms" can be connected together to meet the power needs of the intelligent power distribution network 102 or electricity grid infrastructure 300.

Each renewable energy resource component 116 comprises of a plurality of apparatuses and systems which perform the work necessary to produce power. Each of these renewable energy resource components 116, and each apparatus and system therein, are separately controllable and are independently and variably operable to provide a power requirement 144 as determined and instructed by the intelligent power distribution network 102.

The renewable resource energy management system 100 provides a "network of networks" approach to electricity grid architecture with distributed master control capabilities and a wide-area communications infrastructure that integrates electricity grid automation and optimization concepts with balancing power production to power consumption and maximizing efficiency of power production from renewable energy resources. The renewable resource energy management system 100 is hosted within a distributed computing infrastructure 150 which includes one or more multiple interconnected computing networks 152. System of modules and control systems within the present invention that manage and process data flow, communicate, and provide the necessary input and output signals to perform the various functions discussed herein are resident within this distributed computing infrastructure 150, which may be thought as incorporating cloud and/or grid computing principles to provide the operating environment for the present invention.

The renewable resource energy management system 100 includes a modular load management system having plurality of modules each responsible for one or more functional aspects of the present invention. These include a power distribution module 200 responsible for managing the intelligent power distribution network 102 through a plurality of components, such as a load control component 202, a renewable energy resource pricing and conditions component 204, and a communications component 206. A power generation module 208 is responsible for managing the multi-resource offshore renewable energy installation 104, and also includes a plurality of components, such as a renewable resource efficiency component 210, a renewable resource control component 212, and a communications component 216. A power settlement module 218 is responsible for managing actions and communications between the intelligent power distribution network 102, the multi-resource offshore renewable energy installation 104, and a transmission system 106, one such action being to arrange a transfer of power from the multi-resource offshore renewable energy installation 104 to the intelligent power distribution network 102. The power settlement module 218 includes a transaction resolution component 220, a power production, transmission and delivery component 222, and a communications component 224. The plurality of modules further includes a power transmission module 226, responsible for managing the transfer of the power requirement 144 to the intelligent power distribution network 102. The power transmission module 226 also includes several components, such as a voltage source converter component 220, a transmission control component 228, and a communications component 234.

At least because of the distributed nature of its master control capabilities, the renewable energy resource management system 100 is capable of modular scalability so that many other modules performing various functions may be added and integrated to "plug in" through the distributed computing infrastructure 150. Examples of modules that could be supported by the scalability of the present invention include, but are not limited to, data storage modules capable of accumulating large amounts of data inherent in such systems, and billing modules providing applications such as calculation of the complex charges and credits associated with time-sensitive purchases and sales of power from renewable energy. It is therefore contemplated that any number of modules, performing functions of any type, from high-level system to specifically-designed tasks, may be integrated into the renewable energy resource management system 100.

Communications components 206, 216, 224, and 234 are configured to communicate data within the renewable resource energy management system 100 and the distributed computing infrastructure 150 using high-capacity wireless broadband networks that enable high-speed multi-directional Internet protocol communications. Wireless broadband networks may be of any technical type, such as for example standards-based technologies like WiMAX, within which various computing networks are capable of operating, such as field area networks and SCADA systems. Frequency spectrums for wireless broadband communications may be licensed or unlicensed in the present invention. In one embodiment, the privately-hosted and shared distributed computing infrastructure 150 may utilize one or more licensed, private spectrums as one means of enhancing communications security in the present invention.

The intelligent power distribution network 102 includes the plurality of microgrids 108, each of which are responsible for one or more activities, including communicating with power customers 112 coupled thereto. Each microgrid 108 has at least one controller and a microgrid control system 110, which models data flow between each microgrid 108 and each of its power customers 112, with each device, meter, or other apparatus or system coupled to each power customer 112 capable of predicting and/or determining customer 112 power usage and needs. Examples of such devices include "smart" power meters which have resident controllers capable of analyzing and communicating each customer's patterns to microgrids 108 and/or microgrid control systems 110.

Figure 2A:
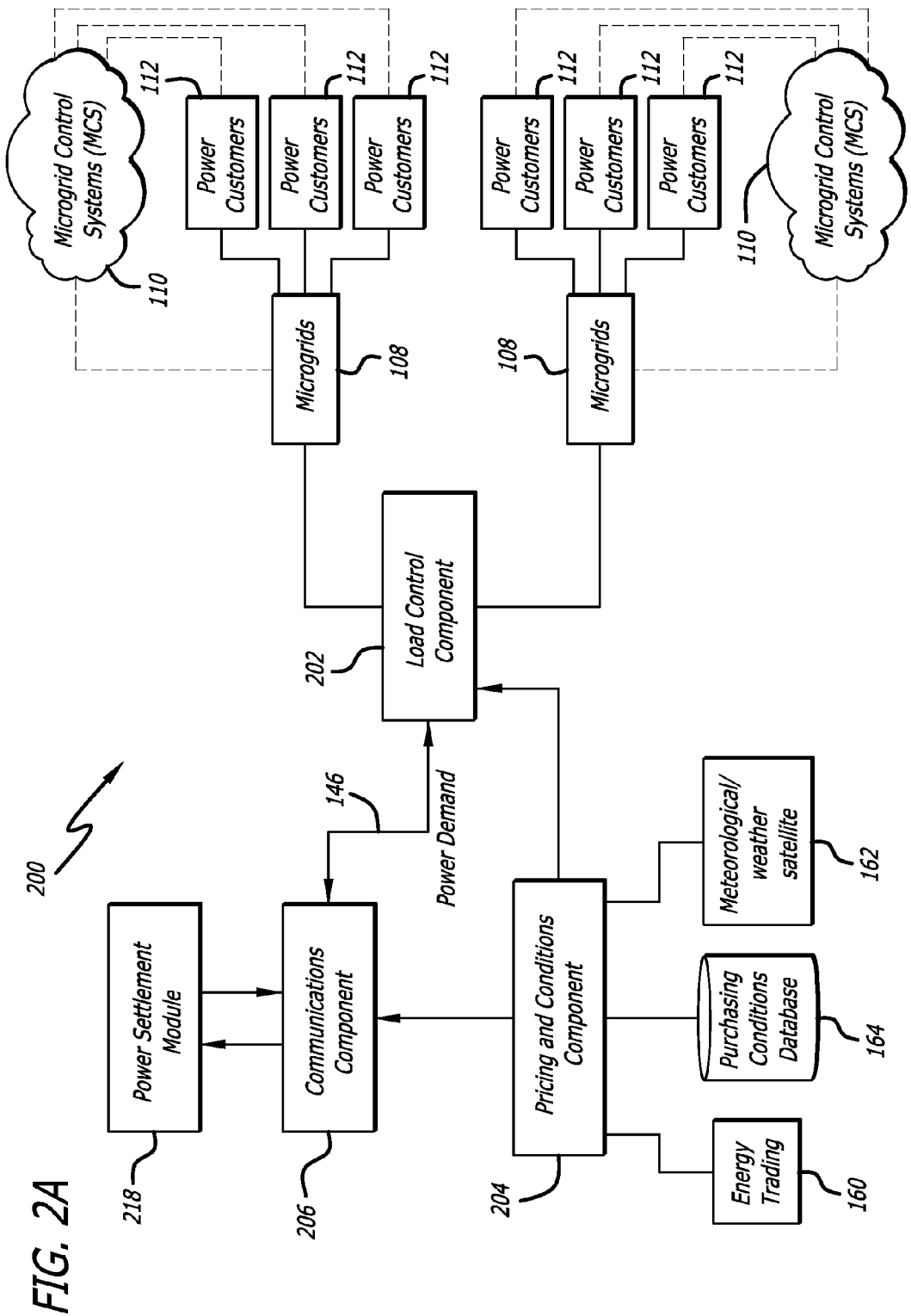
FIG. 2A is a conceptual diagram of components in a power distribution module in a renewable resource energy management system.

FIG. 2A is a conceptual diagram of components in a power distribution module 200 according to the present invention. The power distribution module 200 is a series of processes performed across one or more processors within the renewable resource energy management system 100 and is responsible for various distribution-side functions. The load control component 202 of the power distribution module 200 is configured to perform multiple functions within the distributed computing infrastructure 150. One such function is to forecast a power requirement 144 of the intelligent power distribution network 102 over any specific or given period of time. This is performed at least in part by continually assessing power demand 146 of all microgrids 108 forming the intelligent power distribution network 102, through communications with each device, apparatus, or controller coupled to each power customer 112, and components of each microgrid 108. The load control component 202 may perform this continual assessment in a number of ways, such as by requesting data from controllers configured to determine multiple data sets from each apparatus, device or customer 112. This may also be performed by requesting data from each microgrid 108 via its microgrid control system 110.

The load control component 202, and each microgrid 108 and microgrid control system 110, are capable of bi-directional communications with each device, apparatus, or customer 112 to perform "push" capabilities to send instructions thereto to perform one or more tasks. This may be the case where the load control component 202 and microgrid 108 wish to add or remove devices, apparatuses, or customers 112. This may also be the case where the load control component 202 and microgrid 108 have a need to suspend operation of a particular device, apparatus or customer 112 for a specific reason. One example of this is a customer 112 who is a semiconductor manufacturing plant requiring a specific level of power—where the load control component 202 and/or microgrid 108 sense a voltage spike is about to occur with that customer 112, power delivery can be re-routed so that the voltage spike is avoided and systems coupled to the semiconductor plant are not damaged. It is therefore contemplated that the load control component 202 and/or each microgrid 108 and microgrid control system 110 are fully capable of pushing signals to devices, apparatuses, and customers to perform specific tasks within the power distribution module 200.

The power demand 146 is comprised of multiple variables which form an overall picture of the power needs of each customer 112 over a specific period of time. The multiple variables are influenced by the type of power customer 112 and any particular power needs it may have, its history of power usage, and issues like contractual or regulatory requirements, where applicable, that impose certain limitations on what kind of power can be consumed, and when. Power need may therefore be derived from an aggregation of data reflecting different usage components, such as alternating current, direct current, or both, a usage type, such as for example a semiconductor manufacturing or a plant or a high-security public infrastructure building, and any fluctuation tolerance over the specific period of time at issue which may influence load variances, such as where the number and type of devices requiring power changes over the specific period of time. It is to be understood that many variables exist and many different examples may be used to explain that power needs may be derived from complex modeling of various systems.

The load control component 202 is also configured to manage a delivery of the power requirement 144 to each microgrid 108 in response to the continuing assessment of power demand 146 of each microgrid. This is performed in conjunction with communications with critical distribution-side delivery infrastructure such as receiving locations, transformers, sub-stations, and the like that serve as power intake points from the transmission system 106.

Based on the power need of each customer 112, the load control component aggregates the power demand 146 of each microgrid to arrive at the forecasted power requirement 144 that will eventually be distributed for delivery across the entire intelligent power distribution network 102 over the specific period of time. The power requirement 144 will be both communicated to the power settlement module 218 to arrange the transfer of power from the multi-resource offshore renewable energy installation 104, and to orchestrate, together with each microgrid 108, distribution of the power network across the intelligent power distribution network 102.

The power requirement 144 is the result of mathematical modeling of several factors, including multiple variables that comprise the power need of each customer 112, and other factors affecting the broader intelligent power distribution network 102, such as higher-level electricity grid and microgrid topology that influence usage type (alternating or direct current), usage transmission distance to account for losses, and any fluctuation tolerance, as well as other variables as noted herein, such as regulatory and contractual requirements for using energy derived from particular sources determined by another component of the power distribution module 200. In this way, the modeling used to arrive at the power requirement 144 permits scalability of the present invention by incorporating input data from the both the microgrid 108 level and the power customer 112 level, allowing seamless integration of lower-level customers 112, additional microgrids 108, and multiple large-scale electricity grids serving large geographic areas as needed.

The load control component 202 is therefore responsible for responding to peak demand loads through communications with each microgrid 108 and/or each microgrid control system 110, as well as managing and monitoring load distribution across the entire intelligent power distribution network 102. This load control framework enables many other critical grid infrastructure functions attendant to load distribution, such as faster service restoration in the event of outages or security issues, automatic re-routing of power as needed, and generally ensuring a resilient, flexible grid infrastructure.

The power distribution module 200 also includes a renewable energy resource pricing and conditions component 204, which is responsible for a different function of the power distribution module 200—determining a commodity price range at which power from each renewable energy resource 114 is to be purchased. In addition to generating the forecasted power requirement 144, the power distribution module 200 also provides the power settlement module 218 with this commodity price range.

Energy from renewable resources is a commodity often traded between buyers and sellers on commodities markets and exchanges, and commodity prices for each of the renewable energy resources 114 from which power is produced at the multi-resource offshore renewable energy installation 104 vary widely over time for a variety of reasons, such as for example weather conditions. Therefore, in order to facilitate a cost-effective purchase price for the power requirement 144 to service the intelligent power distribution network 102, the renewable energy resource pricing and conditions component 204 performs an assessment of commodity price data for each renewable resource 114 available for providing the power requirement 144 and forecasts a commodity purchase price range at which each renewable energy resource 114 will be purchased.

Additionally, power customers 112, and the intelligent power distribution network 102 itself, may have certain purchasing conditions related to contractual and regulatory requirements obligating them to purchase energy from particular renewable energy resources at particular times and in particular quantities, such as for example commodity price signals, or other conditions such as tariffs. These purchasing conditions may impose additional constraints on the amount and purchase price of each renewable energy resource 114. Purchasing conditions data may be available from a variety of sources—such as from an external database maintaining such requirements, or any other internal or external source. Regardless, the renewable energy resource pricing and conditions component 160 is responsible for accumulating this information and incorporating it into models for purchases of power relative to each renewable energy resource 114.

The renewable energy resource pricing and conditions component 204 performs one or more processes to model the commodity price data for each renewable energy resource 114 and account for any purchasing conditions, and arrives at the forecasted commodity purchase price range at which reach renewable resource will be purchased for the specific period of time. The renewable energy resource pricing and conditions component 204 may also take into account meteorological conditions in the area where the multi-resource offshore renewable resource installation 120 is located in arriving at this forecast. The forecasted commodity purchase price range is then communicated, via the communications component 206, to the power settlement module 218.

In order to access at least commodity price data and meteorological data, the renewable energy resource pricing and conditions component 204 communicates with one or more external computing networks 154 that are outside the distributed computing infrastructure 150. In the case of commodity prices for each renewable energy resource 114, the renewable energy resource pricing and conditions component 204 may access one or more energy commodity trading platforms 160 to determine the purchase price range for each renewable energy resource 114 for the specific period of time. The owner or operator of one or more electricity grids and/or microgrids 108 coupled to the intelligent power distribution network 102 may also buy, sell, or trade, financial instruments allowing the power distribution module 200 to hedge, or control, exposure to price fluctuations in the commodity price data for each renewable energy resource 114. Similarly the renewable energy resource pricing and conditions component 204 may access one or more meteorological weather platform or site 162, and one or more purchasing conditions database 164. Regardless, the power distribution module 200 is to be understood to include the capability to communicate with one or more external computing networks 154 to accomplish forecasts of commodity price data, meteorological conditions, and where applicable, include purchasing conditions from contractual and regulatory requirements of each microgrid 108 and/or power customer 112 in those forecasts.

The communications component 206 is at least responsible for communicating data to the power settlement module 218, within the power distribution module 200, and with the one or more external computing networks 154. The data to be communicated to the power settlement module 218 includes the power requirement 144, the commodity purchase price range at which the power requirement 144 will be purchased for each renewable energy resource 114 available at the multi-resource offshore renewable energy installation 104, and any purchasing condition relative to the purchase of power from renewable energy resources 114. The communications component 160 includes one or more processes and circuit elements configured to aggregate various data inputs and transmit the resulting aggregated data incorporating the power requirement 144, the commodity purchase price range, and any purchasing condition within the distributed computing infrastructure 150. The communications component 206 therefore incorporates logic elements to ensure incoming data from the load control component 202 and the renewable energy resource pricing and conditions component 204 is in a form that can be utilized by the power settlement module 218 to settle a transfer of the power requirement 144 in accordance with the present invention.

Figure 2B:
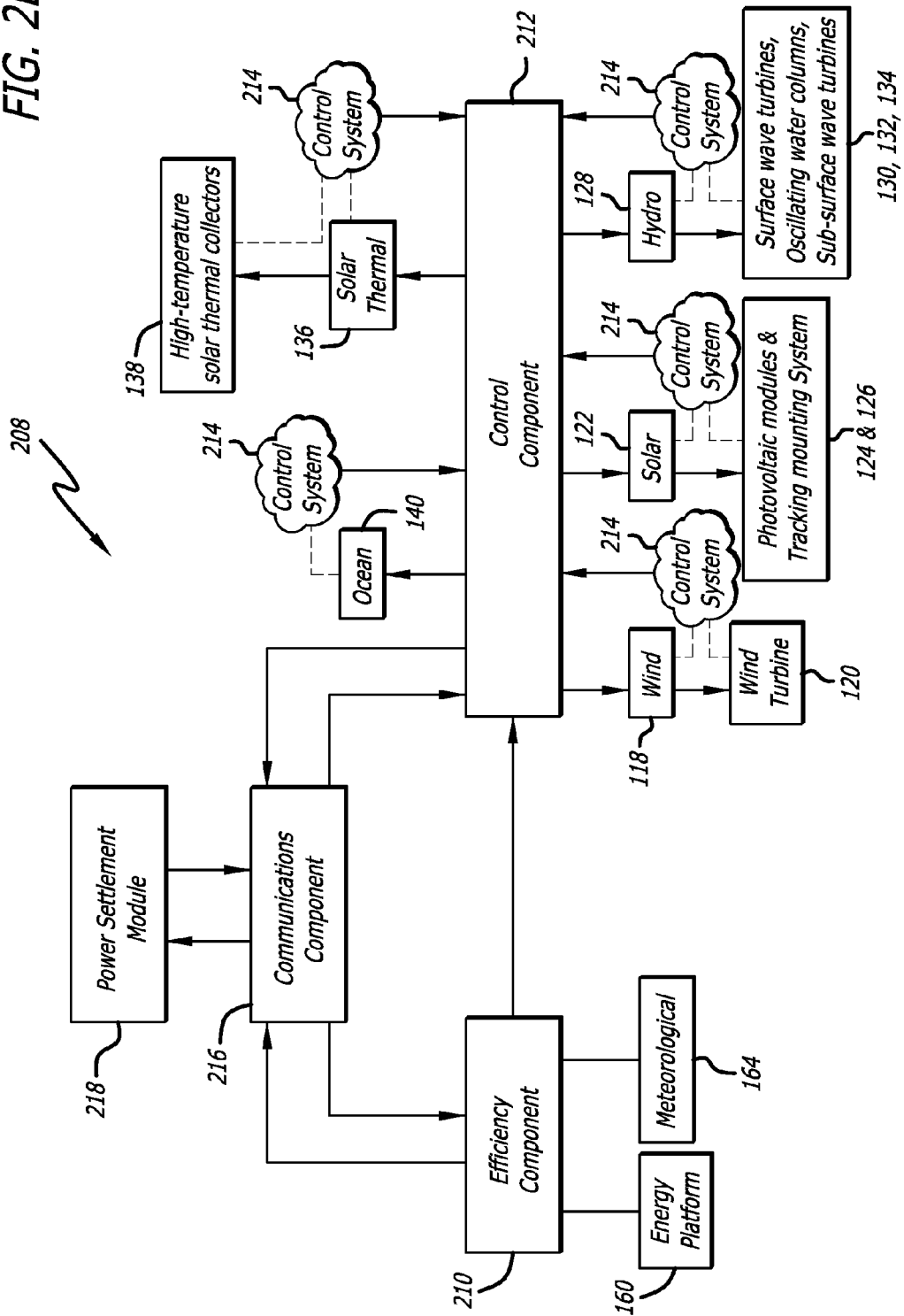
FIG. 2B is a conceptual diagram of components in a power generation module in a renewable resource energy management system.

FIG. 2B is a conceptual diagram of components in a power generation module 208 according to the present invention. The power generation module 208 is a series of processes performed across one or more processors within the renewable resource energy management system 100 and is responsible for various production-side functions governing operations in the multi-resource offshore renewable energy installation 104. The power generation module 208 includes a renewable resource efficiency component 210, a renewable resource control component 212, and a communications component 216.

The renewable resource efficiency component 210 is configured to perform multiple tasks. One such task is to continually assess commodity prices for each renewable energy resource 114, and forecast a commodity selling price range for each renewable energy resource 114. Further, the renewable resource efficiency component 210 continually assesses, and forecasts, meteorological conditions at the location of the multi-resource offshore renewable energy installation 104 to help determine the ability of each renewable resource component 116 to operate over the specific period of time. This meteorological conditions forecast is also incorporated into the commodity price selling range. Both the commodity price selling range and the meteorological conditions forecasts are determined relative to the specific period of time, which is communicated from the power settlement module 218 via the communications component 216.

As with the power distribution module 200, in order to access commodity price data and meteorological conditions data, the renewable energy resource efficiency component 210 must communicate with one or more external computing networks 154 that are outside the framework of the distributed computing infrastructure 150. The communications component 224 facilitate the use of the one or more external computing networks 154 that allow the renewable resource efficiency component 210 to access the one or more energy commodity trading platforms 160, the one or more meteorological weather platform or site 162, and the one or more purchasing conditions database 164 to accomplish forecasts of commodity price data and meteorological conditions. It is also possible that the operator of the multi-resource offshore renewable energy installation 104 may buy, sell, or trade, financial instruments allowing the power generation module 208 to hedge, or control, exposure to price fluctuations in the commodity price data for each renewable energy resource 114 over the specific period of time.

The renewable energy resource control component 212 is configured to continually assess an operational availability and power capacity 148 of each renewable energy resource component 116 at the multi-resource offshore renewable energy installation 104. This is performed through renewable energy resource control systems 214 each at least controlling one of the renewable energy resource components 116. It is further contemplated that each apparatus within each renewable energy resource component 116 may also have a dedicated control sub-system controlling the specific apparatus and responsive to output data from the renewable resource control system 214.

Each apparatus in each renewable energy resource component 116 has a controller coupled thereto capable at least of operating the apparatus to produce power, and to provide input data to either or both of the control sub-system for the apparatus and the renewable resource control system 214 responsible for the respective renewable energy resource component 116. The renewable energy resource control system 214 receives input data from each controller of each apparatus and/or each control sub-system to model the overall operational availability and power capacity 148 of each renewable energy resource component 116.

The renewable energy resource control component 212 uses output signals from each renewable energy resource control system 214 to forecast a power production capacity 148 of each renewable energy resource component 116 over the specific period of time. The specific period of time is communicated from the power settlement module 218 via the communications component 216. This power production capacity 148 forecast is a function of at least the operational availability of each renewable energy resource component 116 as indicated in output signals of the renewable energy resource control systems 214, and may also modulate those signals with the forecasted meteorological conditions and commodity pricing data relative to each renewable energy resource 114 at the multi-resource offshore renewable energy installation 120 that are communicated from the renewable resource efficiency component 210. Therefore the power production capacity 148 reflects the operational availability and a predicted level of operational efficiency of each renewable energy resource component over the specific period of time.

The renewable energy resource control component 212 also receives incoming instructions from the power settlement module 218 following resolution of a transaction, to produce power responsive to the power requirement 144 and the commodity prices of a transaction settled therein. Either of the power settlement module 218 or the renewable energy resource control component 212 may further determine the specific proportions or amount of power from each renewable energy resource component to be produced for the specific period of time. The renewable energy resource control component 212 therefore is capable of determining an operational efficiency level of power production capacity for each renewable energy resource component 116 in response to instructions from the power settlement module 118 and reflective of multiple variables, such as the forecasted meteorological conditions and commodity price data, as well as the power requirement 144 over the specific period of time. Regardless, the renewable energy resource control systems 214 then begin operating each apparatus as determined by either the power generation module 208 or the power settlement module 218. Power will therefore be produced from an efficient combination of renewable energy resources that satisfies the power requirement 144 and balances power production with the power to be consumed by the intelligent power distribution network for the specific period of time.

The communications component 216 is at least responsible for communicating data to the power settlement module 218, within the power generation module 208, and with the one or more external computing networks 154. The data to be communicated to the power settlement module 218 at least includes the power generating capacity 148 of component 116, the commodity selling price range at which the power requirement 144 will be sold for each renewable energy resource 114 available at the multi-resource offshore renewable energy installation 104, and the meteorological conditions forecast. The meteorological conditions forecast may be included regardless of whether it is represented within the forecasted power capacity 148 of each renewable energy resource component 116.

The communications component 216 is comprised of one or more processes and circuit elements configured to aggregate and transmit the data to be communicated to the power settlement module 218, which incorporates the level of operation, the commodity selling price range, and the meteorological conditions forecast, within the distributed computing infrastructure 150. The communications component 216 therefore also includes logic elements to ensure incoming data from the renewable resource efficiency component 210 and the renewable resource control component 212 is in a form that can be utilized by the power settlement module 218 to settle a transfer of the power requirement 144 in accordance with the present invention. The communications component 216 is also responsible for communicating information from the power settlement module 218 to the renewable resource control component 212 for further input data to the renewable energy resource control systems 214.

It should be noted that the operator of the multi-resource offshore renewable energy installation 104 may also have renewable energy selling conditions relative to providing power from certain renewable energy resources 114. It is therefore contemplated that the renewable resource efficiency component 210 will be responsible for assessing this information, and the communications component 216 will be responsible for integrating it into data communicated to the power settlement module 218.

Figure 2C:
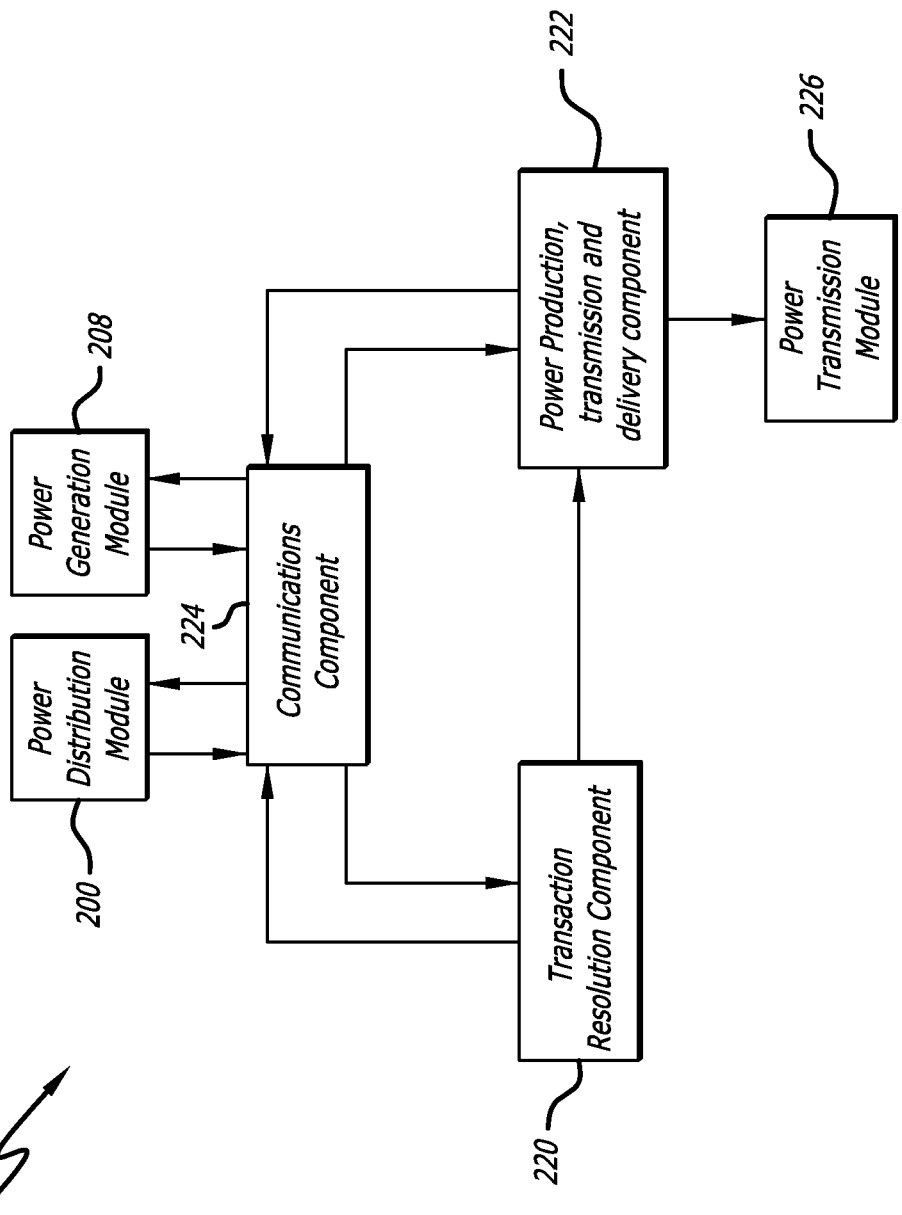
FIG. 2C is a conceptual diagram of components in a power settlement module in a renewable resource energy management system.

FIG. 2C is a conceptual diagram of components in a power settlement module 218 according to the present invention. A power settlement module 218 is another series of processes performed across one or more processors within the renewable resource energy management system 100 and is responsible for various global functions, such as settling the sale and purchase of power generated from each renewable energy resource 114 and arranging a transfer of power from the multi-resource offshore renewable energy installation 104 to the intelligent power distribution network 102 via the transmission system 106. The power settlement module 218 includes a transaction resolution component 220, a power production, transmission and delivery component 222, and a communications component 224. Within these components, the power settlement module 218 communicates data to all of the power distribution module 200, the power generation module 208, and the power transmission module 226 regarding the transfer of power requirement 144.

The transaction resolution component 220 at least performs the function of comparing the commodity selling and purchase price ranges from each of the power distribution module 200 and the power generation module 208 and resolving a final price for power to be generated from each renewable energy resource 114 for the specific period of time to satisfy the power requirement 144. The final price is communicated to both the power distribution module 200 and the power generation module 208.

The transaction resolution component 220 also determines the amount of power to be produced for each component 116 within the power capacity 148 and relative to the power requirement 144 and final price for power to be produced from each renewable energy resource 114. The amount of power is contemplated to be expressed in ranges of amounts that represent proposed levels of operation for each component 116. This is communicated to the power production transmission and delivery component 222, which generates signals to the power generation module 208 to begin producing power from the renewable resource components 116, to the power distribution module 200 to begin preparing to deliver power to each microgrid 108, and to the power transmission module 226 to begin preparing for transmission.

The power settlement module 218 therefore communicates, via the communications component 224, signals to the power generation module 208 the amount of power to be generated from each of the renewable energy resource components 116, responsive to which renewable energy resources 114 have been purchased and in what amounts the respective components 116 are to generate power. Each renewable resource component control system 214 takes these signals as input data to further determine which specific apparatus is to generate power, and instructs each controller and/or subcontrol system in each specific apparatus to be used to operate. In this manner, each renewable energy resource component 116, and indeed each apparatus therein, can be independently and variably controlled to produce the desired power requirement 144.

The power settlement module 218 also includes performs the function of communicating start and stop instructions in one or more signals to the power transmission module 226. These instructions serve to prepare the power transmission module 226 and its components and transmission control system 220 to prepare to transmit the power being generated by the renewable energy resource components 116.

Figure 2D:
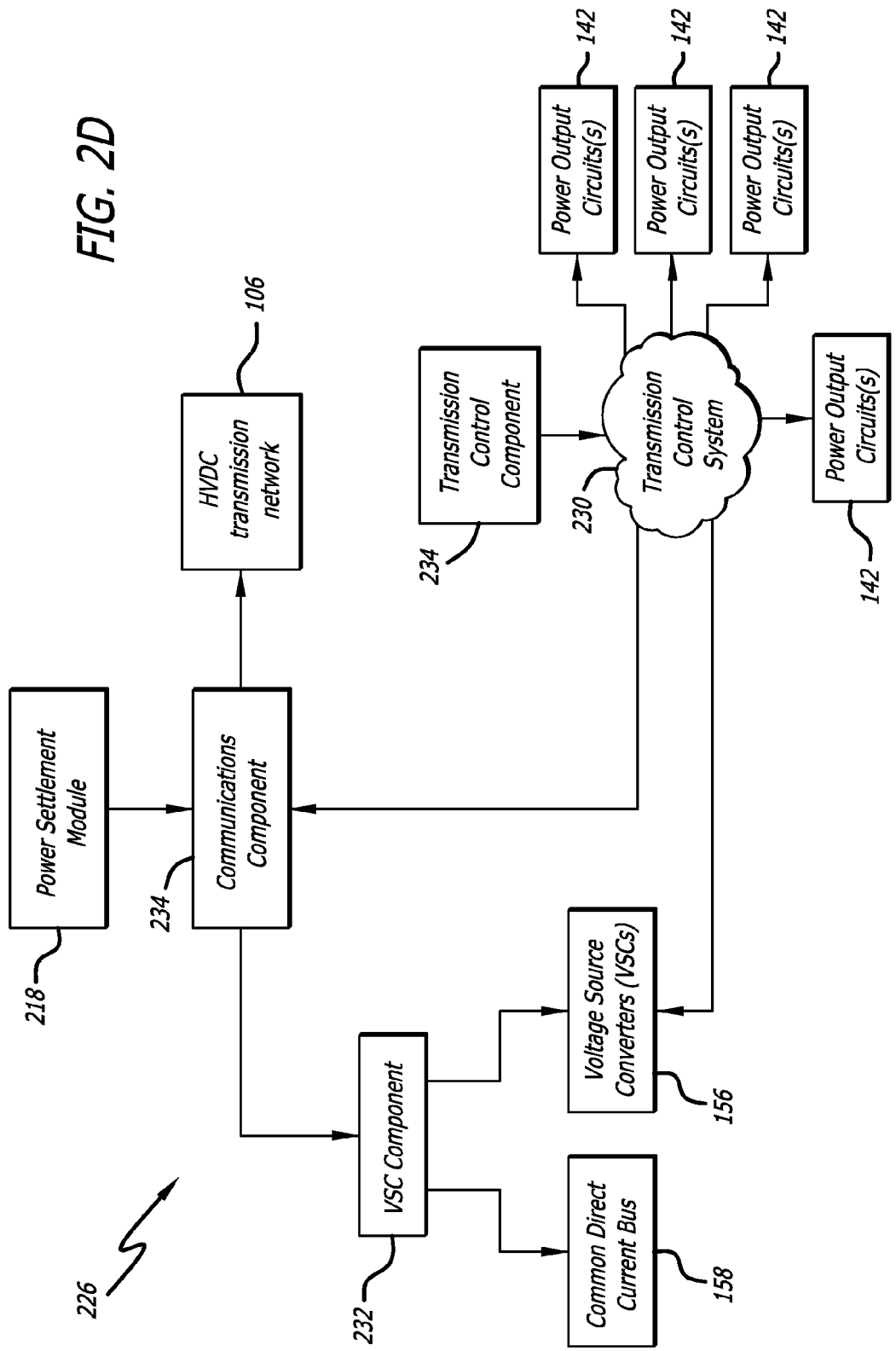
FIG. 2D is a conceptual diagram of components in a power transmission module in a renewable resource energy management system.

FIG. 2D is a conceptual diagram of components in a power transmission module 226 according to the present invention. The power transmission module 226 is a series of processes performed across one or more processors within the renewable resource energy management system 100 and is responsible for various transmission-side functions governing the transmission system 106 over which the power requirement 144 is to be sent. The transmission system 106 is a high voltage direct current (HVDC) system that includes a common direct current bus to which a system of voltage source converters (VSCs) 156 and each power output circuit 142 of each apparatus is coupled. The power transmission module 226 includes a transmission control component 228, which receives signals from the power settlement module 218 via a communications component 234 as input data instructive of several processes to be performed in the transmission of the power requirement 144. The transmission control component 228 includes a transmission control system 230 which performs system check functions such as monitoring the power outputs of each apparatus for any over-production or under-production of power and suggesting adjustments to the renewable energy resource control systems 214, and also ensures that power production matches the capacity of the HVDC transmission system 106. The transmission control component 228 also is responsible for beginning and ending power transmission over the specific period of time.

The power transmission module 226 includes a voltage source converter (VSC) component 232 configured to operate and monitor the system of voltage source converters 156 coupled to the power output circuits 142 of each apparatus in the renewable energy resource components 116. The VSC component 232 helps to ensure that each apparatus and each renewable energy resource component 116 produces the desired output by adjusting the voltage step-up, voltage step-down, and rectification components of the system of voltage source converters 156 in response to signals communicated from the power settlement module 218 and also from output data of the transmission control component 228.

The power transmission module 226 also includes a communications component 234 which includes one or more processes and circuit elements configured to manage communications and operations within, to and from the power transmission module 226. This includes receiving and processing data from the power settlement module 218 to activate the system of voltage source converters 156 through the VSC converter component 232, and providing input data for the transmission control system 230 and initiating starts and stops in the HVDC transmission system 106 through the transmission control component 228.

The present invention includes at least three types of control systems—the microgrid control systems 110, the renewable energy resource control systems 214, and the transmission control systems 230. Each of the microgrid control systems 110, the renewable energy resource control systems 214, and the transmission control system 230 operate within the distribute computing infrastructure 150 to receive input data from various sources as discussed herein, mathematically model physical systems to be analyzed, and produce specific output signals that help to operate the renewable energy resource management system 100 to generate the power requirement 144 over the specific period of time to achieve one or more objectives of the present invention.

Each microgrid control system 110 is responsible, in conjunction with the load control component 202, for controlling each microgrid 108 and each power customer 112 coupled to each microgrid. Because of the decoupled nature of each microgrid 108, there must be a dedicated system capable of performing one or more control functions, such as assessing the power demand 146 of each microgrid 108, managing power delivery to each customer 112 of the microgrid 108, decoupling each microgrid 108 to assume control over distribution and delivery where the need arises, and determining and pushing instructions to each device, meter, or customer 112 if needed. Each microgrid control system 110 receives as input data signals from multiple sources and models several different systems to produce output signals to perform these functions.

To determine power demand 146, for example, each microgrid control system 110 receives input data from the one or more power customers 112 coupled to each microgrid 108. This input data may be generated and communicated by customers 112 themselves, by microgrid controllers operable to collect usage data, and by one or more devices having controllers thereon and coupled to each customer 112. The usage data may be requested by the microgrid control system 230 or communicated automatically via communications component 206.

Collectively, this usage data reflects many different variables, such as customer type, importance level, specific requirements, usage history, usage type, any fluctuation tolerance, and a number and type of devices used by each customer 112. The microgrid control system 110 performs system modeling with these variables for its microgrid 108 and generates an output signal to the load control component 202 indicative of, for the specific period of time, the power demand 146 for that microgrid 108.

Each microgrid control system also receives input data in signals from the load control component 202 that includes the amount of power to be delivered to the intelligent power distribution network 102 and compositions that power delivery will have with regard to renewable energy resources 114, such as for example alternating current or direct current. The microgrid control systems 110 perform system modeling of this data to determine a most appropriate distribution across the customers 112 coupled to each microgrid 108, and generates output signals that instruct one or more infrastructure components such as receiving stations, substations, transformers, and other such components how and where to distribute and delivery power to microgrids 108 and customers 112.

This has particular import in the case of decoupling of microgrids 108. Each microgrid control system 110 is responsible for decoupling each microgrid 108 as the need arises. In this embodiment, the microgrid control system 110 receives input data in a signal from the load control component 202 to decouple and continue to distribute and deliver power to one or more of the microgrids 108 as directed. Similar to above, the microgrid control system 110 analyzes this input signal with the modeled system of the decoupled microgrid 108, and determines a most appropriate distribution across customers 112 who are to continue receiving power.

Each renewable energy resource control system 214 is responsible for controlling each respective renewable energy resource component 116 to which they belong. Each renewable energy resource control system 214 receives input signals from on-board controllers in each apparatus, comprised of data representing one or more operational power capacity characteristics, such as for example the type of apparatus, the time of day, recent performance history, current operating condition, upcoming scheduled maintenance, current weather conditions, and any other variable effecting operability and availability. The renewable energy resource control system 214 uses the input data to create a system model of how each apparatus will perform over the specific period of time, and generates an output signal for the renewable resource control component 212 to generate a power capacity 148 forecast.

In the reverse direction, each renewable energy resource control system 214 receives an input signal comprised of data representing instructions from renewable energy resource control component 212 for operation of each renewable energy resource component 116. The renewable energy resource control system 214 responsible for each component 116 then models each component 116 with the input data to determine output characteristics regarding operating each component, such as which apparatus(es) to operate to generate power, at what speed and capacity, for how much time, and in what combination. This information is contained within output signals generated for each component 116 and each controller in each apparatus.

The transmission control system 230 performs a system of checks to ensure proper functioning of both the power outputs of each renewable energy resource component 116 and the HVDC transmission system 106. The transmission control system 230 receives input data in signals from the power output circuits 142 of each apparatus or each renewable energy resource component 116 or both, prior to connection with the system of voltage source converters 156. The transmission control system 230 compares this data with information from both the power generation module 208 and the power settlement module 218 regarding the known power requirement 144 to determine whether or not power is being under-produced or over-produced. One of two outcomes are decided upon—in the case of a match, the transmission control system 230 does nothing and continues onto the next system check. In the event of a power over or under-production, the transmission control system 230 generates an output signal to one or more of the renewable energy resource control systems 214 to adjust power output up or down. In this way, the transmission control system 230 acts as a feedback loop to one or more of the renewable energy resource control systems 214.

The transmission control system 230 also receives input signals from the output circuits of each voltage source converter 156 after voltage has been stepped or down in response to signals from the VSC component 232. The transmission control system 230 models the voltage source converter 156 output data with known tolerance characteristics of either or both of the power requirement 144 and the HVDC transmission system 106, and determines whether or not voltage levels are within expected tolerances. If they are, the transmission control system 230 does nothing and continues with the further system checks. If they are outside expected tolerances, the transmission control system 106 generates an output signal to the VSC component 232 to adjust voltage step and voltage step down where needed in the voltage source converter system 156.

The transmission control system 230 further receives data in input signals relative to the power output from the common direct current bus 158, and models this data with known load characteristics of the HVDC transmission system 106. This modeling is performed to ensure the power output being transmitted, either in terms of total capacity or voltage levels, does not exceed the load capacity of the HVDC transmission system 106. If there is a mismatch where load capacity will be exceeded, an output signal is generated either to one or more of the renewable energy resource control systems 214 or to the VSC component 232 to make appropriate adjustments as discussed above. The transmission control system 230 may also generate an output signal activating a power feedback loop to remove excess capacity from the HVDC transmission system 106. The power feedback loop may route excess capacity to storage in a temporary battery or to an installation sub-station configured to provide power to the one or more of the renewable energy resource components 116 or to another component area of the multi-resource offshore renewable energy installation 104.

Figure 3:
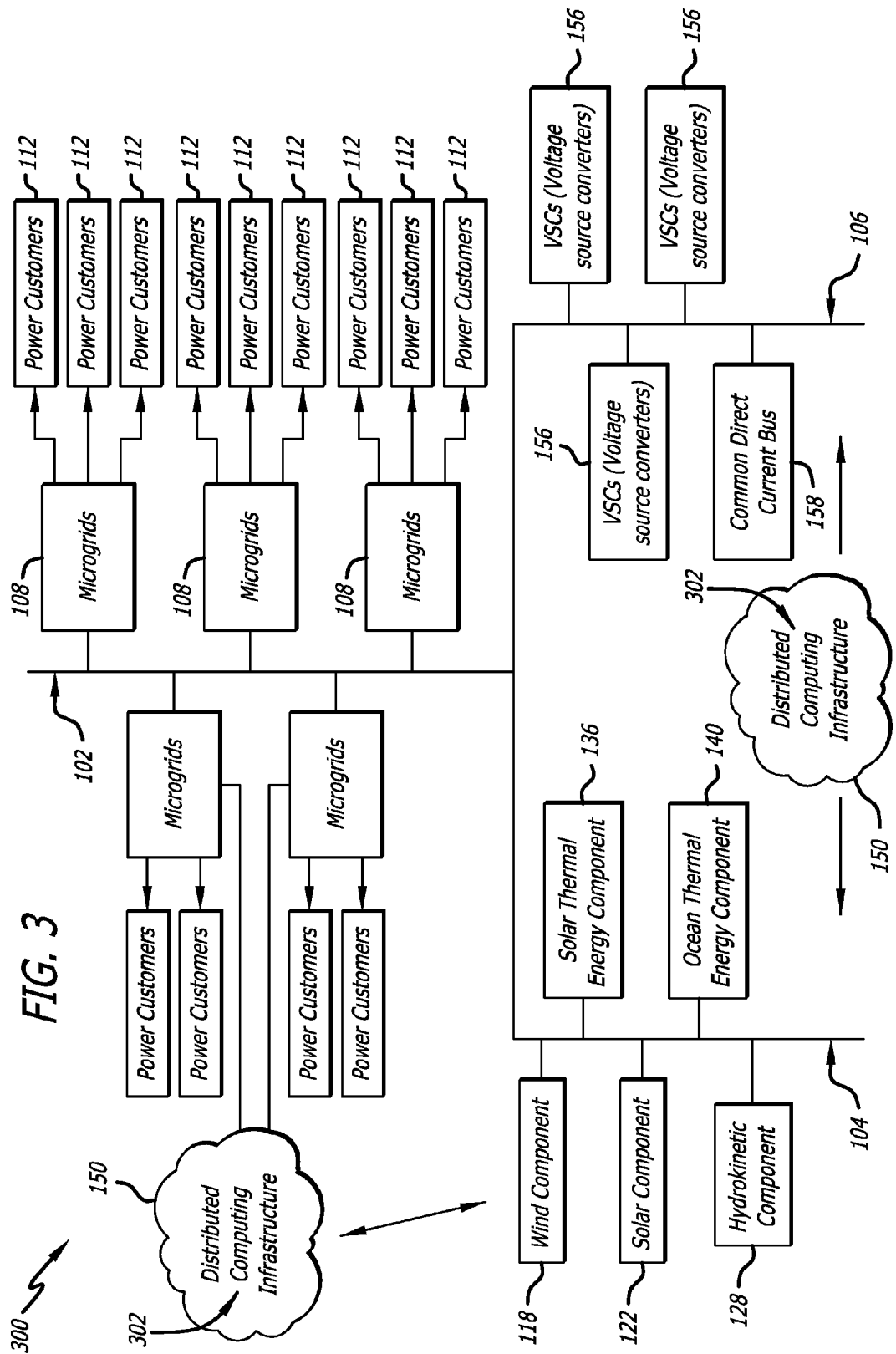
FIG. 3 is a system diagram of an electricity grid infrastructure according to another embodiment of the present invention.

FIG. 3 is a system diagram of an electricity grid infrastructure 300 according to another embodiment of the present invention. The electricity grid infrastructure 300 comprises an intelligent power distribution network 102 as part of a renewable energy-based electricity grid that comprises of one or more microgrids 108 each having a power customer 112 coupled thereto, a multi-resource offshore renewable energy installation 104, an HVDC transmission system 106, and in one aspect, a distributed management system 302 configured to perform one or more functions such as settling a transaction in which power consumption is substantially balanced to power production.

Use of the term "intelligent power distribution network" herein implies that portion of the electricity "grid" which consumes power delivered from any number of sources. Conventional electricity or power "grids" are interconnected networks configured to deliver electricity from suppliers to consumers, or in other words, from sellers to buyers. Typical grids include generating components that produce electricity, transmission components that carry electricity from supplier to receiving locations, and distribution components that carry out activities necessary to ensure that electricity is delivered in the form needed to consumers. Current electricity grid infrastructure is aging and in substantial need of improvement to keep up with a myriad of issues such as increased power demand, instability from fluctuations in power flow, sophisticated end-use technologies, and escalating security concerns.

The electricity generation portion of a typical grid topology includes generating plants, which act as sellers, that connect to the transmission portion to move power across distances. The transmission portion connects the sellers with buyers, which are wholesale customers such as companies or municipalities responsible for distribution of power to consumers, to transfer power. Distribution of power involves many different technologies, such as for example substations, transformers, and power lines that ultimately deliver power to end users.

One type of electricity grid is a "smart" grid which is capable of predicting behavior of power consumers to achieve policy objectives such as enhancing infrastructure stability, reducing peak demand, and managing overall energy consumption and infrastructure performance. Smart electricity grids do this by attempting to increase automation and communication between the various infrastructure components.

An intelligent power distribution network 102 of an electricity grid infrastructure 300 according to the present invention may be thought of in a number of ways. It may be comprised of one or more electricity grids, and also as (or instead as) composed of one or more smaller micro-electricity grids, or microgrids 108. Microgrids 108 may represent many different aspects of the overall consumptive framework of the intelligent power distribution network 102. For example, microgrids 108 may be configured to represent different customers or consumers 112 of power which is delivered to the overall intelligent power distribution network 102, such as different types of consumers, consumers in different geographical locations, consumers with specific and similar power needs, consumers for whom delivery of power is a public security issue, etc.

The term "microgrid" is usually understood to mean a subset of an area within a utility grid, and most often, areas embedded in local or small-scale electricity environments, such as buildings or neighborhoods. The term is also often used to refer to micro-site generation of power particular resources, such as solar panels mounted on buildings.

Microgrids 108 as contemplated by the present invention are expanded to be areas not necessarily limited by geographical region. Instead, microgrids 108 according to the present invention, while remaining subsets of the larger utility grid, may be separate systems that are coupled to, and capable of being decoupled from, the larger utility grid so that power can be separately delivered thereto. Microgrids 108 may also be allocated for any type of power consumer 112, in any location, and relative to any reason for segregating the broader utility grid into smaller microgrids 108.

It is to be understood that regardless of the embodiment referenced, the present invention contemplates that the one or more smaller microgrids 108 which comprise the intelligent power distribution network 102 are separately configured so as to be decoupleable from the intelligent power distribution network 102 as the need arises. Such a decoupling could be performed for many different reasons as discussed herein. Microgrids 108 may also be comprised of one or more sub-microgrids that are configured to communicate power needs of specific things that comprise the broader microgrid 108 to which they are a part. The present invention also contemplates that microgrids 108 can be formed, dissolved, and reconfigured at any time by one or more of the modules and microgrid control systems 110 disclosed herein.

Microgrids 108 therefore have utility in a variety of ways within the present invention. In addition to ensuring that a real-time power requirement 144 is discerned and supplied over a specific time period, other utilities include ensuring grid infrastructure security and providing specific types of power to different microgrids 108 that need such specialized service. Examples of this are microgrids representing semiconductor-based facilities that specifically requires direct current-based power, and microgrids representing specific components of the intelligent power distribution network itself, such as receiving locations 236, substations, relays, and transformers. Regardless, each microgrid 108 is connected through at least one computing network 152 to perform the variety of task as discussed herein. For example, a microgrid 108 representing a residential neighborhood would be configured to communicate, using one or more interconnected computing networks 152, the neighborhood's power needs, based on signals received from and/or sent to one or more devices capable of reading, calculating, and predicting the real-time power needs of each resident of the neighborhood.

One example of an intelligent power distribution network 102 is an electricity grid that is responsible for supplying power to the entire western United States. Such an intelligent power distribution network 102 would be comprised of many microgrids 108 that represent each sub-region, state, or city in that geographical area, and within that, microgrids 108 that represent specific types of power consumers 112. Each of these microgrids 108 would be separately coupled to the intelligent power distribution network 102 so that power requirement 144 for each would be delivered according to the load control component 202 and a respective microgrid control system 110. In this embodiment, the distributed load management system 302 of the electricity grid infrastructure 300 is responsible coordinating a power delivery to each microgrid 108 together with the microgrid control system 110 in an amount that satisfies real-time needs.

Infrastructure security is easily facilitated by the microgrid 108 framework according to the present invention. A microgrid 108 may be representative of key public infrastructure installations, such as for example ports, military sites, water installations such as reservoirs and dams, high-speed rail lines, canals, metro systems, other power generation facilities, manufacturing and production facilities, etc. By allowing for the immediate decoupling of a microgrid 108 in the event of security issue with the overall intelligent power distribution network 102 or to another microgrid 108, power can be continually supplied to a particular microgrid 108, and its represented customers 112 who need power to keep public services smoothly operating in the event of such a security issue.

The power distribution module 200, and the distributed load management system 302, together with each microgrid 108 and with each microgrid control system 11, coordinate and carry out any decoupling as the need arises. It is therefore to be understood that electricity grid topology according to the present invention is integrated to support such an interconnected and coupled framework that is at the same time capable of being fragmented in real time to deliver power separately to specific microgrids 108 should the need arise The present invention further contemplates that because power is generated and transmitted entirely in direct current form by the HVDC transmission system 106, it is possible for power to be supplied to microgrids 108 requiring direct current directly without having to process and transform incoming power at a receiving location 236. This can be done, for example, in a situation where the receiving location itself is under a security threat. Microgrids 108 can be configured, via the power distribution module 200, distributed load management system 302, and microgrid control systems 110, to operate entirely on direct current that can be supplied directly by the multi-resource offshore renewable energy installation 104.

The present invention also further contemplates that an intelligent power distribution network 102, and microgrids 108, may be configured to either run entirely on direct current, or to be able to easily switch from requiring alternating current to requiring direct current as the need arises at receiving locations 236 or substations serving particular microgrids 108. For example, in a security situation where the power transformation at the main network-level receiving location 236 from direct current to alternating current has been disabled, power can be delivered to key microgrids 108 directly in direct current. It is contemplated that a microgrid 108 may have the ability to switch its represented customers 112 to a direct current model, either permanently or temporarily, in such a situation.

Accordingly, electricity grid infrastructure 300 according to the present invention is to be configured so that microgrids 108 can be quickly decoupled from the main intelligent power distribution network 102 and supplied with direct current power via the HVDC transmission system 106 in the event of an incident requiring such a decoupling and continued supply of uninterrupted power. In this way, the electricity grid infrastructure 300 is a flexibly topology that is capable of expanding and contracting and that supports resiliency and stability when problems that threaten the supply of power arise.

As the world becomes increasingly dependent on non-renewable and carbon-based energy resources, and substantial supply, price, and geopolitical stability problems attendant thereto proliferate, it is apparent that there is a strong need for a system and method of providing power generated entirely from renewable energy resources 114. In another embodiment of the present invention, a multi-resource offshore renewable energy installation 104 and method of operation provide an intelligent power distribution network 102 with all of its power needs from one source that generates energy from multiple renewable energy resources 114.

Figure 4:
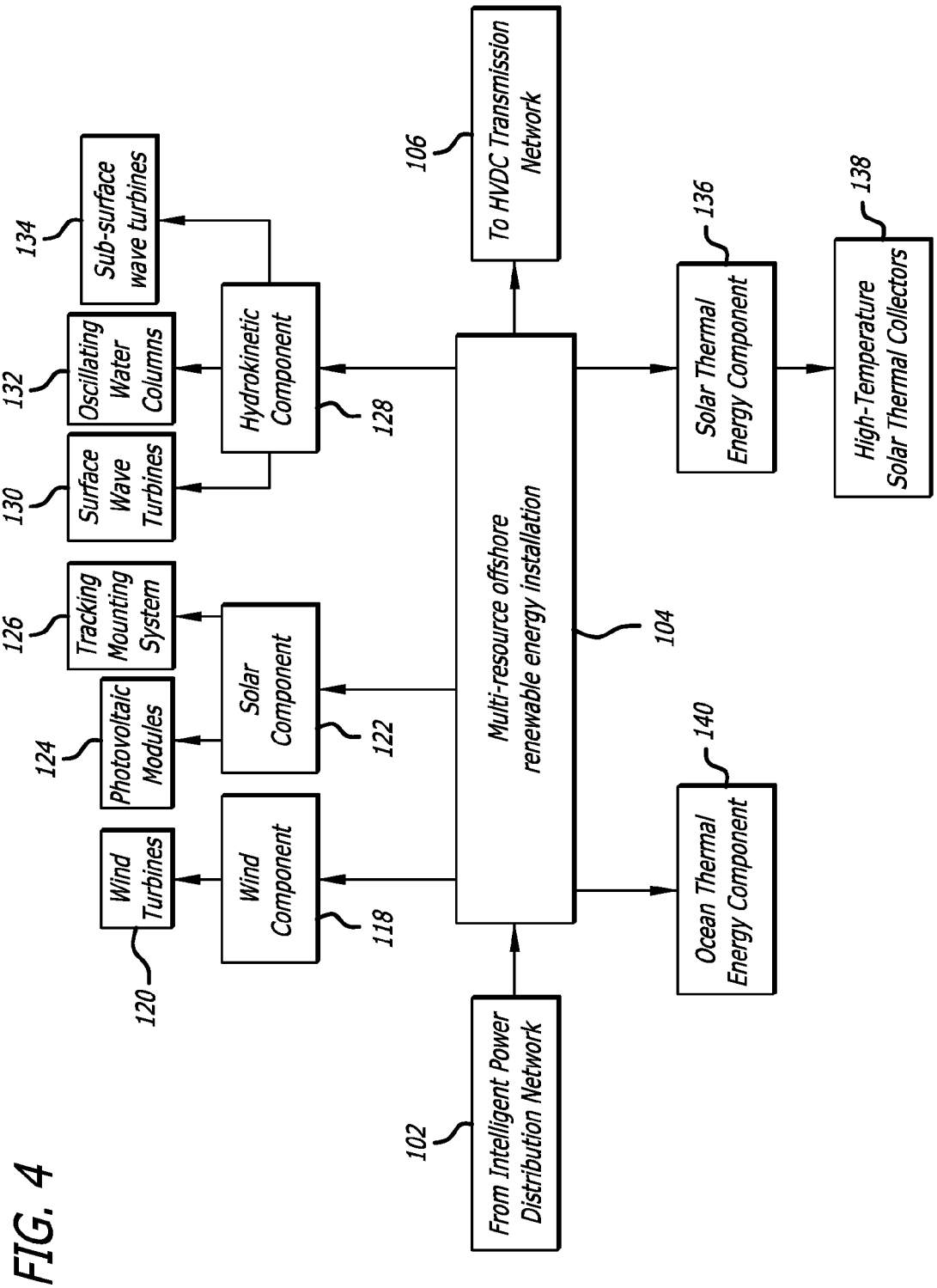
FIG. 4 is a system diagram of a multi-resource offshore renewable energy installation according to another embodiment of the present invention.

FIG. 4 is a system diagram of a multi-resource offshore renewable energy installation 104. The multi-resource offshore renewable energy installation 104 is an apparatus or series of apparatuses that includes multiple renewable energy resource components 116 for generating power that are each derived from a particular renewable energy resource 114. The multi-resource offshore renewable energy installation 104 is contemplated to be a deep-ocean, marine installation at sites located far from land, typically in the range of greater than 50 km from the nearest onshore intelligent power distribution network 102. However, it is within the scope of the present invention that such a multi-resource offshore renewable installation 104 could be a marine installation located near to the shore and also on freshwater bodies such as lakes and rivers, whether naturally occurring or man-made.

The multiple renewable energy resource components 116 include a wind component 118 deriving power from wind energy, a solar component 122 deriving power from solar energy, a hydrokinetic component 128 deriving power from wave and tidal current energy, and a solar thermal component 136 deriving power from the process of heating ocean water using solar thermal energy. The present invention may also include an ocean thermal energy conversion component 140. Each of the wind component 118, the solar component 122, the hydrokinetic component 128, the solar thermal component 136, and the ocean thermal energy conversion component 140 include an array of apparatuses each coupled to a respective renewable energy resource control system 214.

In accordance with other aspects and embodiments of the present invention, the multi-resource renewable energy installation 120 is configured so that a maximum efficient operational power-generating capacity of each apparatus, and each renewable energy resource component 116, is achieved. The multi-resource offshore renewable energy installation 104 is therefore intended to present a solution to the problem of inefficiencies that are naturally present in renewable resource components 116 generating power from resources such as wind, solar, hydrokinetic, and solar thermal energy.

Figure 6:
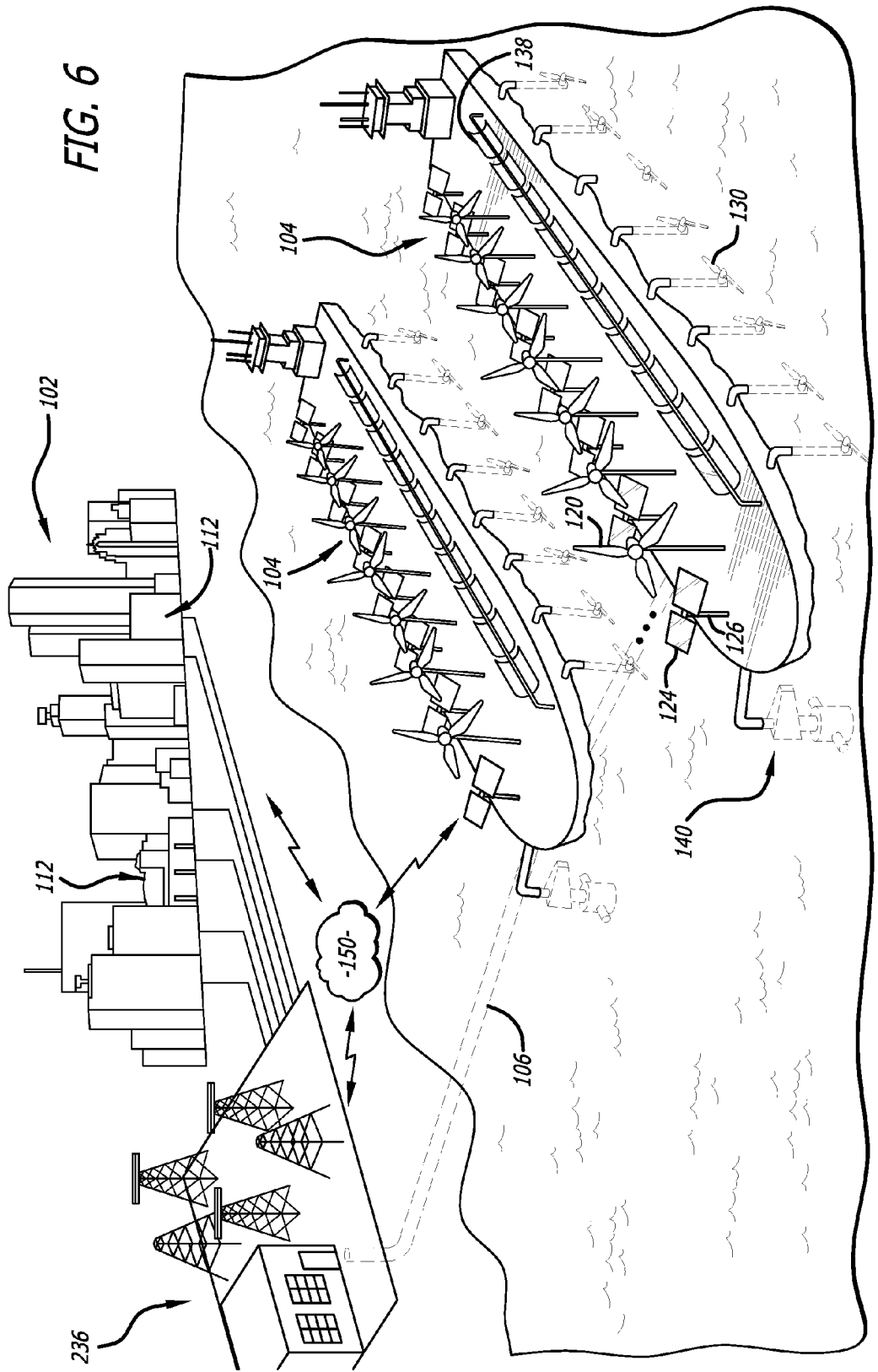
FIG. 6 is a perspective plan view of a multi-resource offshore renewable energy installation and electricity grid infrastructure according to one embodiment of the present invention.

The present invention contemplates that there are numerous ways in which components capable of generating power from multiple renewable energy resources 114 can be configured on such multi-resource offshore renewable energy installation 104. For example, the installation may be a large-scale energy farm with hundreds or thousands of apparatuses working to generate power. Each of the components 116 may be configured in any number of ways in such a large-scale energy farm to generate power and take advantage of fluctuations in weather conditions. The multi-resource offshore renewable energy installation 104 is therefore completely scalable from an ultra-high capacity multi-megawatt or gigawatt installation to serve large-scale power consumers 112, to a medium to low-capacity installation to serve power consumers 112 with smaller demand. FIG. 6 and FIG. 7 show overall perspective and top plan views of embodiments of the multi-resource renewable energy installation 104.

The multi-resource offshore renewable energy installation 104 may be both permanent and temporary and have both permanent and temporary components 116 as portions thereof to achieve the scalability contemplated herein. It may be entirely fixed so that it anchors to the ocean floor and is therefore a permanent installation. It may also be a floating structure, in whole or in part, with temporary anchoring mechanisms and with some or all of the components 116 being movable to other locations as needed. It may further be a combination of permanent and temporary components, for example in a configuration in which power transmission components are in fixed portion while power generating components 116 are temporary components that can "dock," as in the case of one or more barges having components installed thereupon, to the permanent components or to other mobile components. Regardless of possible configuration, the present invention considerably reduces construction and operating costs by implementing technologies that substantially reduce the possibility of lasting environmental damage. With the present invention, there is no need to drill for non-renewable carbon-based resources that may pollute environment as such an installation site.

Costs can be further minimized due to the ability to maximize operational power-generating capacity. In the present invention, power production is substantially balanced with power consumption, so that only an amount of power required is produced over the specific period of time, at least in part because the renewable energy resource control systems 214, responsive to signals regarding settled transactions, can variably and separably operate each apparatus within each component 116. Therefore, present invention may not require large, expensive, and environmentally damaging power storage components at either the multi-resource offshore renewable energy installation 102 or the intelligent power distribution network 102.

The multi-resource offshore renewable energy installation 104 may be a purpose-built semi-submersible production platform that is a floating vessel capable of supporting the renewable energy resource components 116 in multiple configurations in deep water and other harsh offshore environments. This provides a mobile yet stable operational platform needed to produce power at the multi-resource offshore renewable energy installation 104 and that is capable of being deployed in different locations, regardless of whether each of the renewable energy resource components 116 are permanently part of the multi-resource offshore renewable energy installation 104 or removably and/or temporarily coupled thereto, such as for example on separate pontoons or barges.

Stability in such a mobile semi-submersible platform according to this embodiment results from, when in an operational position, a hull structure being submerged at a deep draft so that the multi-resource offshore renewable energy installation 104 is less susceptible to wave loadings. Operational components of the semi-submersible platform remain well above the ocean surface. The mobile semi-submersible production platform acquires buoyancy from ballasted components below the surface, and one or more support columns connecting the operational components and the ballasted components. Other anchoring components may also be utilized for further stability of the mobile semi-submersible platform.

Draft can be adjusted by deballasting the below-surface components so that the mobile semi-submersible production platform becomes a surface vessel capable of deployment to a different location. In this regard, a mobile semi-submersible production platform as described may be transportable using a heavy-lift installation transport vessel. Such a heavy-lift installation transport vessel is able to move all or part of the installation 104 by ballasting itself to submerge a majority of its structure, maneuvering beneath the multi-resource offshore renewable energy installation 104, and then deballasting to lift up all or part of the multi-resource offshore renewable energy installation 104 as cargo.

In a further embodiment, where each of the renewable energy resource components 116 are separately coupled to form the multi-resource offshore renewable energy installation 104, the installation 104 may also comprise one or more offshore support vessels that perform various roles, such as operational activities, transmission system support, and emergency support. Each such vessel may be separately mobile so that the multi-resource offshore renewable energy installation 104 is composed of many interchangeable parts. Each renewable energy resource component 116 may itself be embodied on a mobile semi-submersible platform as well. Therefore, the entire multi-resource offshore renewable energy installation 104 can be thought of as a being deployable in any configuration necessary to meet the objectives of the present invention.

Offshore support vessels such as a transmission system support vessel may be a key consideration for engineers and planners in the mobile aspect of the semi-submersible production platform that forms all or part of a multi-resource offshore renewable energy installation 104. Transmission system support is a consideration in order to ensure that regardless of where the multi-resource offshore renewable energy installation 104 and/or the multiple renewable energy resource components 116 are deployed, access to the high voltage direct current transmission system 106 is available to transfer power to the intelligent power distribution network 102. In one embodiment, vessels such as those providing transmission system support may provide node-based transmission cables for easy and remote access to a main undersea transmission line, particularly where the multi-resource offshore renewable energy installation 104 is mobile semi-submersible production platform. The present invention therefore contemplates that the multi-resource offshore renewable energy installation 104 may include a main operational platform, semi-submersible or otherwise, where multiple mobile semi-submersible production platforms connect to a main transmission line supported by such offshore support vessels. Such a configuration permits the multi-resource offshore renewable energy installation 104 to include multiple mobile semi-submersible production platforms supporting renewable energy resource components 116 that may be spread out over hundreds of kilometers and connected by transmission cables that are branches of the node at the main operational platform.

The multi-resource offshore renewable energy installation 104 includes a solar component 118 for generating power from solar energy. Components generating power from solar energy are known as photovoltaics, which convert solar rays into electricity using panels, or modules, composed of solar cells containing a photovoltaic material. The present invention contemplates that the solar energy component 118 is comprised of many such photovoltaic modules 124 mounted on one or more mounting systems 126. Mounting systems 126 may be either tracking or fixed mounting systems and photovoltaic modules 124 may be mounted in any configuration thereon, such as for example in portrait configuration or landscape configuration, or any combination thereof.

The present invention contemplates that at least one of the circuits connecting an array of photovoltaic modules 124, the tracking mounting systems 126, and individual photovoltaic modules 124 include one or more controllers capable of sending input data in signals to a renewable energy resource control system 214, as well as capable of receiving signals therefrom. These controllers are capable of moving or tilting an angle of inclination of each array of photovoltaic modules 124 on a tracking mounting system 126 operable at the multi-resource offshore renewable energy installation 104 in response to an output signal of a renewable energy resource control system 214.

Therefore, one or more renewable resource control systems 214 are configured to control the photovoltaic modules 124 and tracker mounting systems 126 and communicate with controllers coupled to each to maximize operational capacity of the solar component 118. Where control systems 214 operate to generate responses in the photovoltaic modules 124 directly, it is contemplated that control over specific photovoltaic modules and in arrays of photovoltaic modules 124 as a whole are both within the scope of the present invention. The controllers in each photovoltaic module or in each array of photovoltaic modules 124 are configured, in one aspect, to communicate at least a real-time operational ability and power capacity 148 of each photovoltaic module or array of photovoltaic modules 124 and real-time sunlight availability conditions, and in another aspect, to respond to output signals generated by the control system 214 to perform a host of actions, such as for example controlling power output circuits 142 in response to instruction from the power settlement module 218. Similarly, controllers in each tracking mounting system 126 are configured, in one aspect to, communicate at least a real-time operational availability of each tracking mounting system 126 and real-time sunlight availability conditions, and in another aspect, to respond to output signals generated by the control system 214 to perform actions such as adjusting the angle of inclination, or switching power generation circuits on or off where multiple photovoltaic modules 124 are connected together thereon.

Photovoltaic modules 124 are solid state devices that typically generate a power output as direct current electricity. Because of this, the power output of each array of photovoltaic modules 124 can be provided directly to the system of voltage source converters 156 and the common direct current bus 158 in the HVDC transmission system 106, eliminating the need for further components such as inverters to convert from one current form to another. The HVDC transmission system 106 must still account for variances in both the voltage output of each photovoltaic module or array of photovoltaic modules 124 and with power outputs of other components 116, depending on the output configuration, and therefore the transmission control system 230 monitors the power output of each as discussed here. The transmission control system 230 may act as feedback for the renewable energy resource control system 214 where power output needs to be adjusted to ensure common voltage levels across the common direct current bus 158, may therefore generate an output signal to adjust one or more components of the solar component 118 accordingly. The transmission control system 230 may also monitor and instruct the system of voltage source converters 156 to either step up the output voltage or step down the output voltage as needed to ensure a uniform voltage level across the common direct current bus 156. Regardless, the present invention ensures that the power output is properly monitored and adjusted for transmission, distribution and delivery.

The present invention further contemplates that in this manner, as with other renewable energy resource components 116, both the power generation module 208, the renewable energy resource control systems 214, transmission control system 230, and the voltage source converters 156 allow for very flexible operation of photovoltaic modules 124 to arrive at a proper power production capacity that satisfies the power requirement 144 over the specific period of time, as other systemic objectives such as transmission system stability.

This flexibility allows for substantial design freedom in selecting components. Solar cells forming photovoltaic modules 122 may be made of any material suitable for installation in deep-ocean conditions so that the photovoltaic modules 122 are able to maintain operating capacity in potentially difficult weather conditions far from shore. Materials typically must have characteristics matched to the spectrum of available light at the installation site, but it is contemplated that where a large number of photovoltaic modules 124 are installed at the multi-resource offshore renewable energy installation 104, many different types of photovoltaic modules may be combined and utilized to achieve optimal efficiency.

In one embodiment, materials such as nanocrystalline silicon in which the photovoltaic materials embedded with nanoparticles may have particular utility in installations such as those disclosed herein, where weather conditions make maintenance a significant challenge. Nanoparticles may be further embedded with components such as microcontrollers which are capable of communicating certain operating conditions to the renewable resource control system 214 responsible for the photovoltaic module 124, array of photovoltaic modules 124, and tracking mounting system 126 having photovoltaic modules 124 installed thereon. Use of photovoltaic modules 124 fabricated of materials of this type may increase the ability to assess real-time operational availability and real-time weather conditions, and increase overall durability of the solar component 118.

Photovoltaic modules 124 and mounting systems 126 may be either fixed or permanent components of the multi-resource offshore renewable energy installation 104, or temporarily coupled thereto so as to be mobile and deployable to different locations or as needed. Regardless, an array of photovoltaic modules 124 may also be part of a floating installation of renewable resource components 116, or a fixed installation with support that is permanently anchored to the seabed. Floating installations do not require permanent anchoring mechanisms and can be positioned, for example, on pontoon-based supports or on barges, reducing the environmental impact and increasing the scalability of the multi-resource offshore renewable energy installation 104. Floating installations may also be capable of being raised and lowered as needed to protect photovoltaic modules 124 and mounting systems 126, and keep them operational, in the event of storms, rough seas, very large waves, or other adverse environmental conditions.

Cooling of photovoltaic modules 124 can be achieved from winds at the installation site or from the ocean water itself, particularly where ocean thermal energy conversion components are implemented that produce desalinized water from heating ocean water. Floating or temporary structures also provide the benefit of allowing photovoltaic modules 124 to be installed and used to generate power in locations, particularly very deep ocean waters, where seabed anchoring is not feasible.

The wind component 118 is comprised of a plurality of large-scale, large capacity, commercial high-speed wind turbines 120. Each wind turbine 120 includes a rotor with blades turning about either a horizontal or vertical axis, and has a controller resident within a nacelle, coupled to operational and power-generating circuit elements. The present invention contemplates that the wind component 118 is comprised of an array of wind turbines 120 each coupled to a respective renewable energy resource control system 214.

One or more of the renewable resource control systems 214 are configured to control the wind turbines 120 by receiving input data from and sending output signals to controllers coupled to operational and power-generating output circuits inside each nacelle. They are configured, in one aspect, to communicate at least a real-time operational availability and power capacity 148 of each wind turbine 120, and in another aspect, to respond to output signals generated by control system 214 to perform a host of actions, such as for example turning an power output circuit 142 on or off, adjusting rotor speed, or where applicable, rotating each rotor to maximize operations under changing wind conditions, in response to instruction from the power settlement module 218.

Wind turbines 120 commonly generate a power output in alternating current form. The power output of each wind turbine 120 therefore needs to be rectified to direct current prior to connection to the common direct current bus 158, and voltage source converters 156 adjust the voltage level with either voltage step-up or step-down transformers to ensure a compatible voltage level. Power outputs of all of the wind turbines 120, and the voltage output level of the system of voltage source converters 156, are monitored by the transmission control system 230, in addition to the power outputs of all other apparatuses that are being operated to generate power, to make further adjustments if necessary as discussed herein.

If it is the case that power is generated as direct current, no inverter is needed for connection of the power output circuitry to the common direct current bus 158 and the HVDC transmission system 106. The transmission control system 230 must still however account for variances in the voltage of each such power output, and therefore would monitor the power output and voltage source converters 156 as above, in conjunction with power output of other apparatuses of other renewable energy resource components 116 and in conjunction with each renewable energy resource control system 214, and make adjustments accordingly.

The present invention further contemplates that in this manner, as with other renewable energy resource components 116, both the power generation module 208, the renewable energy resource control systems 214, transmission control system 230, and the voltage source converters 156 allow for very flexible operation of the wind turbines 120 to arrive at a proper power production capacity that satisfies the power requirement 144 over the specific period of time, as other systemic objectives such as transmission system stability.

This flexible operational approach allows for many different configurations of the wind component 118 within the scope of the present invention. For example, wind turbine rotors may be axially rotatable to maximize capacity where wind direction changes over time. One or more rotors on a wind turbine tower may also be movable so that it can either function as a wind turbine 120 or wave turbine 130 or 134 as further discussed herein. Multiple rotors on each tower may be used for to function as power generating devices for both sources, so that one rotor is a wind turbine 120, while the other is a wave turbine 130 or 134.

As with photovoltaic modules 124, wind turbines 120 may be coupled so as to be either a fixed or permanent components of the multi-resource offshore renewable energy installation 104, or temporarily coupled thereto so as to be mobile and deployable to different locations or as needed. Regardless, an array of wind turbines 120 may also be mounted on a floating structure that allows each wind turbine 120 to generate electricity in deep ocean waters where seabed anchors or piles are not feasible, or on a fixed structure with support that is permanently anchored to the seabed. The fixed structure may be the tower supporting the wind turbine 118 itself. Floating installations do not require permanent anchoring mechanisms and can be positioned, for example, on pontoon-based supports or on barges, reducing the environmental impact and increasing the scalability of the multi-resource offshore renewable energy installation 104.

The hydrokinetic component 128 may include multiple types of apparatuses, each of which utilize some type of wave conversion to harness energy from movement of water, whether based on surface waves, sub-surface currents, or tides, to generate electrical power output. These wave energy conversion devices are well-suited for deep water applications as disclosed herein, as deep water waves and currents generate greater energy and therefore are more useful at generating power in high-capacity installations. The present invention includes at least one of surface wave turbines 130, oscillating water columns 132 and sub-surface or undersea wave turbines 134 within the hydrokinetic component 128.

The surface and sub-surface wave turbines 130 and 134 are contemplated to be large-scale, large capacity, commercial turbines each having a rotor with blades turning about either a horizontal or vertical axis to generate power. Each turbine has a controller resident within a nacelle, coupled to operational and/or power-generating output circuits. Oscillating water columns 132 generate power as waves enter and exit a partially submerged collector, causing a water column inside the collector to rise and fall and drive air inside the column into a turbine. The turbines have controllers coupled to operational and/or power-generating output circuits therein. The present invention contemplates that the hydrokinetic component 128 is comprised of an array of each of the surface wave turbines 130, oscillating water columns 132, and sub-surface wave turbines 134.

Each surface wave turbine 130, oscillating water column 132, and sub-surface turbine 134 is coupled to one or more renewable energy resource control systems 214 configured to control the hydrokinetic component 128 and generate output signals to controllers coupled to each surface wave turbine 130, oscillating water column 132, and sub-surface turbine 134 to separably and variably operable each apparatus. The controllers are configured, in one aspect, to communicate at least a real-time operational availability and power capacity 148 of each surface wave turbine 130, oscillating water column 132, and sub-surface turbine 134, and in another aspect, to respond to output signals generated by the renewable energy resource control system 214 to perform a host of actions, such as for example turning power output circuits 142 on or off, adjusting rotor speed, adjusting a water depth at which ocean water is obtained in the case of the oscillation water columns 130, or where applicable, rotating each rotor to maximize operations under changing surface wave or ocean current conditions, in response to instruction from the power settlement module 218. Factors having substantial influence on operational availability and power capacity 148 of each surface wave turbine 130, oscillating water column 132, and sub-surface wave turbine 134, and the ability to variably operate each, are meteorological conditions such as surface wave and sub-surface ocean current strength, which may be continuously measured at the offshore multi-resource renewable energy installation 120.

The hydrokinetic components 128 are assumed to generate a power output in alternating current form. Where this is the case, the power output of each surface wave turbine 130, oscillating water column 132, and sub-surface turbine 134 therefore needs to be rectified to direct current prior to connection to the common direct current bus 158, and voltage source converters 156 adjust the voltage level with either voltage step-up or step-down transformers to ensure a compatible voltage level. Power outputs of all of the surface wave turbines 130, oscillating water columns 132, and sub-surface wave turbines 134, and the voltage output level of the system of voltage source converters 156, are monitored by the transmission control system 230, in addition to the power outputs of all other apparatuses that are being operated to generate power, to make further adjustments if necessary as discussed herein.

If it is the case that power is generated as direct current, no inverter is needed for connection of the power output circuitry to the common direct current bus 158 and the HVDC transmission system 106. The transmission control system 230 must still however account for variances in the voltage of each such power output, and therefore would monitor the power output and voltage source converters 156 as above, in conjunction with power output of other apparatuses of other renewable energy resource components 116 and in conjunction with each renewable energy resource control system 214, to make adjustments accordingly.

The present invention further contemplates that in this manner, both the power generation module 208, the renewable energy resource control systems 214, transmission control system 230, and the voltage source converters 156 allow for very flexible operation of the surface wave turbines 130, oscillating water columns 132, and sub-surface turbines 134 to arrive at the proper power production capacity that satisfies the power requirement 144 over the specific period of time, as well as transmission system stability and other objectives.

This flexible operational approach allows for many different configurations of the hydrokinetic components 128 within the scope of the present invention. For example, surface or sub-surface wave turbine rotors may be axially rotatable to maximize capacity where wave or current direction changes over time. One or more rotors on a turbine tower may also be movable so that it can either function as a wind turbine 120 or wave turbine 130 or 134. Multiple rotors on each tower may be used for to function as power generating devices for both sources, so that one rotor is a wind turbine 120, while the other is either a surface wave turbine 130 or a sub-surface wave turbine 134.

The various apparatuses comprising the hydrokinetic component 128 may also be coupled so as to be either a fixed or permanent component of the multi-resource offshore renewable energy installation 104, or temporarily coupled thereto so as to be mobile and deployable to different locations or as needed. Regardless, any of the surface wave turbines 130, oscillating water columns 132, and sub-surface wave turbines 134 may also be mounted on a floating structure that allows each apparatus to generate electricity in deep ocean waters where seabed anchors or piles are not feasible, or on a fixed structure with support that is permanently anchored to the seabed. The fixed structure may also be a tower supporting a surface turbine 130 or sub-surface wave turbine 134 itself. Floating installations do not require permanent anchoring mechanisms and can be positioned, for example, on pontoon-based supports or barges, reducing the environmental impact and increasing the scalability of the multi-resource offshore renewable energy installation 104. Pontoons and barges floating on the ocean surface may support any of the surface wave turbines 130, oscillating water columns 132, or sub-surfaces wave turbines 134, either separately or in combination.

A platform of multiple oscillating water columns 132, whether floating or fixedly positioned, may also be capable of being raised or lowered as necessary to protect the equipment to keep them operational, such as in case of storms, rough seas, very large waves, or other adverse environmental conditions. This helps to ensure that waves are capable of entering and exiting the water column 130 to ensure continued operation of this portion of the hydrokinetic component 128, allow for easier maintenance, and to ensure that damage does not occur.

The solar thermal component 136 utilizes thermal energy, or heat, harnessed from solar energy. The solar thermal component 136 includes an array of high-temperature solar thermal collectors 138 that use lenses and mirrors to capture and intensify the sun's rays to heat ocean water, which generates steam that drives a turbine generator.

High-temperature solar thermal collectors 138 according to this embodiment include intake systems through which ocean water is collected and transported to be heated. These can be configured to collect ocean water at variable water depths to maximize the operational performance of each collector 138, since the temperature of ocean water various according to depth, time of year, current patterns, and other variables.

High-temperature solar thermal collectors 138 may be mounted on tracking-type mounting systems to maximize operational efficiency, so that the angle of tilt or inclination is moveable to account for different positions of the sun at different times of the day and year. Lenses and mirrors may also be mounted on movable systems to increase the ability of each collector 138 to maximize its operating efficiency. High-temperature solar thermal collectors 138 may be of any conventional design suitable for durable use in deep-ocean, weather intensive environments. Typical conventional designs include parabolic troughs, towers, parabolic dishes, Fresnel reflectors, and other design capable of high-temperature operation.

One or more renewable resource control systems 214 are configured to control the high temperature solar thermal collectors 138, the system of mirrors and lenses, and the tracking mounting systems on which both are mounted, and communicate with controllers coupled to operational and power-generating output circuits. The controllers are configured, in one aspect, to communicate at least a real-time operational availability and power capacity 148 of each apparatus and real-time sunlight availability conditions, and in another aspect, to respond to output signals generated by the control system 214 to perform a host of actions, such as for example turning power output circuits 142 on or off in response to instruction from the power settlement module 218, and rotating, turning, or adjusting the angle of inclination of any of the high-temperature solar thermal collectors 138, system or mirrors and lenses, and tracking mounting systems.

The solar thermal energy components 134 contemplated herein are assumed to generate a power output in alternating current form. Where it is generated as alternating current, the power output of each high-temperature solar thermal collector 138 therefore needs to be rectified to direct current prior to connection to the common direct current bus 158, and voltage source converters 156 adjust the voltage level with either voltage step-up or step-down transformers to ensure a compatible voltage level. Power output of all of the high-temperature solar thermal collectors 138, are monitored by the transmission control system 230, in addition to the power outputs of all other apparatuses that are being operated to generate power, to make further adjustments if necessary as discussed herein.

If it is the case that power is generated as direct current, no inverter is needed for connection of the power output circuitry to the common direct current bus 158 and the HVDC transmission system 106. The transmission control system 230 must still however account for variances in the voltage of each such power output, and therefore would monitor the power output and voltage source converters 156 as above, in conjunction with power output of other apparatuses of other renewable energy resource components 116 and in conjunction with each renewable energy resource control system 214, to make adjustments accordingly.

As with other renewable energy resource components, both the power generation module 208, the renewable energy resource control systems 214, transmission control system 230, and the voltage source converters 156 allow for very flexible operation of high-temperature solar thermal collectors 138 to arrive at the proper power production capacity that satisfies the power requirement 144 over the specific period of time, as well as transmission system stability and other objectives. This flexible operational approach allows for many different configurations of the high-temperature solar thermal collectors 138 within the scope of the present invention. For example, different types of collector designs may be used in combination, together with different types and configurations of mirrors and lenses.

High-temperature solar thermal collectors 138 according to one embodiment may also be coupled so as to be either a fixed or permanent components of the multi-resource offshore renewable energy installation 104, or temporarily coupled thereto so as to be mobile and deployable to different locations or as needed. Regardless, any of the high-temperature solar thermal collectors 138, lenses and mirrors, and mounting systems may also be mounted on a floating structure that allows each apparatus to generate electricity in deep ocean waters where seabed anchors or piles are not feasible, or on a fixed structure with support that is permanently anchored to the seabed, or both.

Floating installations do not require permanent anchoring mechanisms and can be positioned, for example, on pontoon-based supports or on barges, reducing the environmental impact and increasing the scalability of the multi-resource offshore renewable energy installation 104. Floating installations may also be capable of being raised and lowered as needed to protect equipment, components and mounting systems, and keep them operational, in the event of storms, rough seas, very large waves, or other adverse environmental conditions. Cooling capability can be generated from the ocean water itself, particularly in floating structures and particularly where ocean thermal energy conversion components are implemented that produce desalinized water from heating ocean water.

High-temperature solar thermal collectors 138 may be used to generate power either during the day or at night, since heat can be stored in large quantities to be supplied to the steam cycle of the collectors at night. The present invention therefore contemplates, that heat storage tanks may be also components on the multi-resource offshore renewable energy installation 104.

The multi-resource offshore renewable energy installation 104 may also be configured to include an ocean thermal energy conversion component 140 to generate a power output based on differences between cooler deep water and warmer shallow or surface water. This difference is used to generate steam which operates a turbine to generate electricity. Different types of systems may be incorporated, such as closed, open, or hybrid systems which take advantage of the water temperature variations in different ways. One such closed-loop system boils warm surface seawater directly in a low-pressure container. The resulting expanded steam, which becomes pure fresh water as a result of losing its salt, drives a turbine attached to an electrical generator. It can then be condensed into a liquid by exposure to cold temperatures from waters found greater depths in a different chamber. This has the potential to produce desalinized fresh water, suitable for drinking water at the offshore installation site or transmission for onshore use.

In addition to provide an additional source of power for the power requirement 144, this renewable resource 114 can be used to self-power the offshore multi-resource renewable energy installation 120, together with any feedback loop incorporated in any of one of the power output circuits 142 to make use of excess capacity generated. This component is well-suited for such uses, because the temperature variances between water at different depths may be not enough for large-capacity power production. However, it is likely that at deep ocean installations, water depths will be great enough to generate some notable difference in temperatures, thereby providing at least one source of power for the multi-resource offshore renewable energy installation 104 itself. Use of a renewable energy resource component 116 to self-power the multi-resource offshore renewable energy resource installation 120 reduces the environmental impact of the installation by reducing the need for connecting to a non-renewable source of power.

As with other renewable resource components 116, the ocean thermal energy component 140 may communicate with one or more renewable resource control systems 214 and the transmission control system 230 to generate power to satisfy the power requirement 144. These control systems are configured to control the ocean thermal energy component 140 and communicate with controllers coupled to operational and power-generating output circuits inside each apparatus to separably and variably operate each one. The controllers are therefore configured, in one aspect, to communicate at least a real-time operational availability and power capacity 148 of an ocean thermal energy component 140, and in another aspect, to respond to output signals generated by the renewable energy resource control system 214 to perform actions such as turning power output circuits 142 on or off, and adjusting a water depth at which ocean water is obtained in response to instruction from the power settlement module 218. Meteorological conditions such as changes in sea water temperature at different depths have substantial influence on the operational availability of each ocean thermal energy component 140 and the ability to variably operate each, and therefore these are continuously measured at the offshore multi-resource renewable energy installation 120.

The ocean thermal energy components 140 contemplated herein are also assumed to generate a power output in alternating current form, and therefore the power outputs needs to be rectified to direct current prior to connection to the common direct current bus 158, and voltage source converters 156 adjust the voltage level with either voltage step-up or step-down transformers to ensure a compatible voltage level. Power outputs of all of the ocean thermal energy components 140 are monitored by the transmission control system 230, in addition to the power outputs of all other apparatuses that are being operated to generate power, to make further adjustments if necessary as discussed herein.

As with other components 116, where it is the case that power is generated as direct current, no inverter is needed for connection of the power output circuitry to the common direct current bus 158 and the HVDC transmission system 106. The transmission control system 230 must still however account for variances in the voltage of each such power output, and therefore would monitor the power output and voltage source converters 156 as above, in conjunction with power output of other apparatuses of other renewable energy resource components 116 and in conjunction with each renewable energy resource control system 214, to make adjustments accordingly.

Ocean thermal energy components 140 may be either fixed or permanent components of the multi-resource offshore renewable energy installation 104, or temporarily coupled thereto so as to be mobile and deployable to different locations or as needed. Regardless, they may also be part of a floating installation of renewable resource components 116, or a fixed installation with support that is permanently anchored to the seabed. Floating installations do not require permanent anchoring mechanisms and can be positioned, for example, on pontoon-based supports or on barges, reducing the environmental impact and increasing the scalability of the multi-resource offshore renewable energy installation 104. Floating installations may also be capable of being raised and lowered as needed to protect ocean thermal energy converters 140, and keep them operational, in the event of storms, rough seas, very large waves, or other adverse environmental conditions.

As referenced herein, the various embodiments of the present invention can be configured in many different ways. In one embodiment, the present invention is contemplated to be available as a "packaged" configuration of multiple processes, hardware, and apparatuses that together act as a self-contained system. Such a self-contained system can be deployable and scalable for temporary uses, such as to provide power grid infrastructure such as in a field military base or large-scale disaster response situations.

Distributed computing infrastructure 150 provides a computing and network operational architecture for the renewable resource energy management system 100, multi-resource offshore renewable energy installation 104, and electricity grid infrastructure 300 of the present invention. The distributed computing infrastructure 150 utilizes the combined computing power of multiple interconnected computing networks 152 to manage data flow, perform data processing functions, and facilitate communications in the present invention. It also provides the power distribution module 200, the power generation module 208, the power settlement module 218, and power transmission module 226 with flexibility to perform the critical power grid infrastructure functions with which they are assigned. The distributed computing infrastructure 150 is therefore a high-level computing architecture designed to spread computational power around multiple computing environments in a distributed fashion and which aggregates the many interconnected computing networks 152 to perform the multiple processes needed to host and perform the present invention.

The various modules and control systems of the present invention may therefore be thought of as utilizing one or more available computing resources as needed from across the distributed computing infrastructure 150, regardless of where particular elements of each are stored. Alternatively, system elements such as control systems may be thought of as being "embedded" at various points within the distributed computing infrastructure 150, such as for example renewable energy resource control systems 214 may be embedded within one or more controllers capable of operating each renewable energy resource component 116. Regardless, it is to be understood that many different configurations are possible and contemplated within the distributed computing infrastructure 150.

In one embodiment, the distributed computing infrastructure 150 employs cloud computing principles and technology to provide a distributed platform and resources for hosting multiple modules and data access, processing, modeling, and storage, as well as communication between infrastructure systems and components, so that no one portion of the overall renewable energy resource management system 100, multi-resource offshore renewable energy installation 104, or electricity grid infrastructure 300 is required to host, process, or store information. The distributed computing infrastructure 150 may also be thought as a grid computing architecture in which middleware provides the link between the various modules and control systems of the present invention to facilitate distributed data processing. Regardless, the present invention employs the cloud-based or grid-based distributed computing infrastructure 150 and interconnected computing networks 152 in multiple ways to meet the operational functions and objectives disclosed herein. Additionally, it is to be understood that communications with the distributed computing infrastructure 150 may be through both wired and wireless means.

Microgrid control systems 110, for example, each perform the critical task of determining real-time power needs of customers 112 coupled to each microgrid 108 without needing a physical location near a microgrid 108 or its customers 112. Microgrid control systems 200 may be resident anywhere within the cloud or grid-based distributed computing infrastructure 150 and utilize interconnected computing networks 152 and controllers to collect input data regarding the microgrid 108 and the power customers 112 coupled thereto, mathematically model power needs relative to physical characteristics of the microgrid system they are responsible for controlling, and generate output data used in one aspect to arrive at the power demand 146 for the microgrid 108, and in another aspect, to manage delivery of the necessary power requirement 144 to each microgrid 108 as discussed herein.

Furthermore, the distributed computing infrastructure 150 may be a privately-hosted, shared computing environment in which secure data communications, processing, and storage necessary to accomplish the present invention are possible. Effectively a private, secure cloud, the distributed computing infrastructure 150 according to this aspect of the present invention has substantial application in supporting enhancements in power grid infrastructure security given the increasing need to protect power grid infrastructure from security threats as noted in detail herein.

Microgrid 108 decoupling has specific application in grid infrastructure security, together with the distributed, decentralized nature of the computing environment. The distributed computing infrastructure 150 allows communication and connectivity of modules and control systems, and data functions and services managed and controlled by them, to be re-routed and re-deployed where necessary, permitting power to continue to be delivered uninterrupted in the event of a major security threat or attack intended to disrupt flow of power to key public infrastructure. Extra layers further solidify the security aspects of the present invention, as the privately-hosted, shared distributed computing infrastructure 150 allows easier integration of specific information security measures designed to limit the possibility that systems can be penetrated and increasing the difficulty in locating and disrupting distributed services.

The distributed computing infrastructure 150 is capable of facilitating access and communication with one or more external computing networks 154 to carry out one or more tasks in practicing the present invention. Data from these types of external networks 154 provide information needed by one or more modules and control systems of the present invention. An example an external computing network 154 is an energy commodity trading platform 160 or other public or private exchange involving commodities and capable of providing pricing of commodities. Another example is a weather satellite system 162 capable of providing meteorological data. Yet another example is a database 164, public or private, that tracks regulatory requirements for purchasing renewable energy resources as well as public or private databases for tracking contractual requirements for the same.

In the present invention, there are several reasons for monitoring, modeling, and forecasting data relative to meteorological conditions and energy commodity prices. Within both the renewable resource energy management system 100 and the electricity grid infrastructure 300 embodiments of the present invention, it is imperative to assess energy commodity prices to arrive at an optimized purchase price for each renewable energy resource 114 to be purchased. This is influenced by many factors, such as purchasing conditions related to contractual and regulatory requirements obligating the purchase of particular renewable energy resources 114 at particular times and in particular quantities, such as for example commodity price signals, or other conditions such as tariffs. Meteorological conditions may also be a factor in energy commodity prices over the specific period of time, and therefore meteorological condition models for each renewable energy resource 114 may be components in mathematical models of energy commodity prices over the period of time to be assessed.

Similarly, within both the renewable energy management system 100 and the multi-resource offshore renewable energy installation 104 embodiments of the present invention, it is imperative to assess both meteorological conditions and energy commodity prices to arrive at both an optimized sale price for each renewable energy resource 114 to be purchased and an efficient operational availability and power capacity 148 for each renewable resource component 116. For example, an operator of a multi-resource offshore renewable energy resource installation 120 may model meteorological conditions at the installation site and energy commodity prices to forecast an operational availability and power capacity 18 of each renewable energy resource component 116 at the installation.

Monitoring and modeling meteorological conditions is a function performed by one or more of the power generation module 208, the power distribution module 200, and the power settlement module 218 in the renewable energy resource management system 100, by one or more renewable resource control systems 214 in the multi-resource offshore renewable energy installation 104, and by one or more of various modules and control systems in the distributed management system 302 in the electricity grid infrastructure 300 according to different embodiments of the present invention. This function is used to forecast of meteorological conditions over the specific period of time so that the power requirement 144 can be satisfied, so that the operational power capacity 148 of each renewable resource component 116 at a multi-resource offshore renewable energy installation 104 is maximized to ensure efficiency and cost-effectiveness, and to balance power production with power consumption.

Many different measurements of meteorological conditions are contemplated with the scope of the present invention, and therefore it is possible that many external networks 154 are to be used to access such data. Among the different meteorological conditions to be measured include wind speed and direction influenced by weather patterns indicating storms, sunlight conditions including time of sunrise and sunset, cloud patterns, surface and sub-surface ocean wave, current and tidal conditions and patterns, ocean temperature at various depths, humidity, barometric pressure, precipitation, and many other variables, each of which alone or in combination affect the performance, availability, and capacity of the renewable energy resource components 116 available at the multi-resource offshore renewable energy installation 104.

Similarly, monitoring and modeling renewable energy resource commodity pricing is also a function performed by one or more of the power generation module 208, the power distribution module 200, and the power settlement module 218 in the renewable energy resource management system 100, by one or more renewable resource control systems 214 in the multi-resource offshore renewable energy installation 104, and by one or more of various modules and control systems in the distributed management system 302 of the electricity grid infrastructure 300 according to different embodiments of the present invention. This function is used to forecast both a commodity purchase price, in the case of the intelligent power distribution network 102, and a commodity selling price, in the case of the multi-resource offshore renewable energy installation 104, over the specific period of time, for each renewable energy resource 114 available to satisfy the power requirement 144.

Commodity pricing is a component of satisfying the power requirement 144 because energy prices fluctuate widely over time and for each type of renewable energy resource 114, whether it be solar, wind, hydrokinetic, solar thermal, ocean thermal, or any other energy resource. Incorporating a commodity pricing component allows an efficient operational power capacity 148 of each renewable energy resource component 116 to be achieved, and informs a cost-effective, efficient exchange of resources by allowing both the buyer of power and the seller of power arrive at a price point for each resource. Therefore, monitoring and modeling renewable energy commodity prices helps the power requirement 144 to be satisfied, and helps to predict the operational power capacity 148 of each renewable resource component 116 to maximize efficiency and cost-effectiveness. It is contemplated that least some of the renewable energy resources 114 from which power is to be generated are traded within one or more energy commodities exchanges. It is therefore further contemplated that a forecast of commodity prices must take into account at least those that are traded on exchanges.

Types of external computing networks 154 that may be accessed to monitor and forecast meteorological conditions include, but are not limited to, proprietary weather assessment networks, sites capable of accessing data from weather satellites, governmental weather system portals, other particular weather-related websites, and any other networks capable of aggregating useful data relative to assessing and predicting meteorological conditions. Types of external computing networks 154 that may be accessed to monitor and forecast energy commodity prices include, but are not limited, proprietary commodities exchange trading platforms, particular commodities pricing information sites, and any other networks capable aggregating useful commodity price information that can be used to assess and predict energy commodity prices.

The distributed computing infrastructure 150 may also host one or more artificial neural networks tasked with heuristically modeling data within the present invention to perform a variety of functions, such as predicting commodity pricing and meteorological conditions, assessing power usage patterns and power 146 customers, and assessing power capacity 148 of the renewable energy resource components 116. These artificial neural networks introduce data modeling tools to the framework of the various embodiments of the present invention to heuristically model the complex relationships between inputs and outputs of data and to identify and take advantage of data patterns. Artificial neural networks may take on many forms within the distributed computing infrastructure 150, such as for example multiple remote computing environments or program calls that are accessed when needed by the modules and control systems within the present invention.

Artificial neural networks therefore may perform a critical role in increasing and improving the efficiency of the present invention by, for example, heuristically assessing weather conditions at the deep-ocean location of the multi-resource offshore renewable energy installation 104 site to learn how to predict when weather conditions are most and least favorable for operation of a particular renewable resource component 116, and by heuristically assessing future trends in energy commodity prices to learn how to predict when pricing of commodities is most and least favorable for operation of the particular renewable resource component 116 and predict a range of prices at which commodities are to be both bought and sold, and combining the two concepts to further increase efficient performance within the present invention.

Heuristic modeling in artificial neural networks can be performed alone or as part of the many variables and characteristics that comprise modeling and forecasting for energy commodity prices and meteorological conditions. It may also help to identify instances where one or more of the modules and control systems operative within the present invention should buy, sell, or trade, financial instruments in conjunction with commodity prices of renewable energy resources 114. Artificial neural networks may therefore be a useful tool, incorporated with other mathematical modeling within the present invention, to predict energy commodity pricing trends and when hedging may be advantageous.

In one example of the use of an artificial neural network, where a microgrid control system 110 responsible for assessing power usage patterns to determine a power demand 146 of power customers 112 coupled to a microgrid 108, the microgrid control system 110 may initiate a program call to introduce a separate predicted assessment of power usage as part of a closed-loop system of analyzing output signals of the microgrid control system 110. Such a program call initiates a heuristic assessment of data aggregation reflecting different usage components, usage type, any fluctuation tolerance over the specific period of time at issue which may influence load variances, and other possible variables affecting power demand 146 as noted herein. This effectively introduces a data modeling tool to act as a comparative check of the assessed power demand 146, to ensure accurate data collection and sampling. Artificial neural networks may therefore have significant application acting as data modeling checks to ensure, for example, that error rates are properly managed.

Energy installations located offshore face the significant problem of transferring power to the onshore power consumer in an efficient manner. For deep-sea installations, this may be done using an undersea direct current transmission link, since long-distance alternating current transmission systems suffer losses that are unacceptably high. However, modern electricity grid infrastructure requires substantially all power in alternating current form for downstream delivery to consumers thereof. Power consumers that do require direct current power rely on substations to ensure they are getting the correct form of electricity. Additionally, many wind, hydrokinetic, and solar thermal manufacturers configure their apparatuses to generate power in alternating current form to easily meet the needs of the electricity grid consumers. Providers therefore have the problem of components generating a mix of AC and DC power, which must be transferred as DC, and then delivered as AC and then rectified later if necessary.

Figure 5:
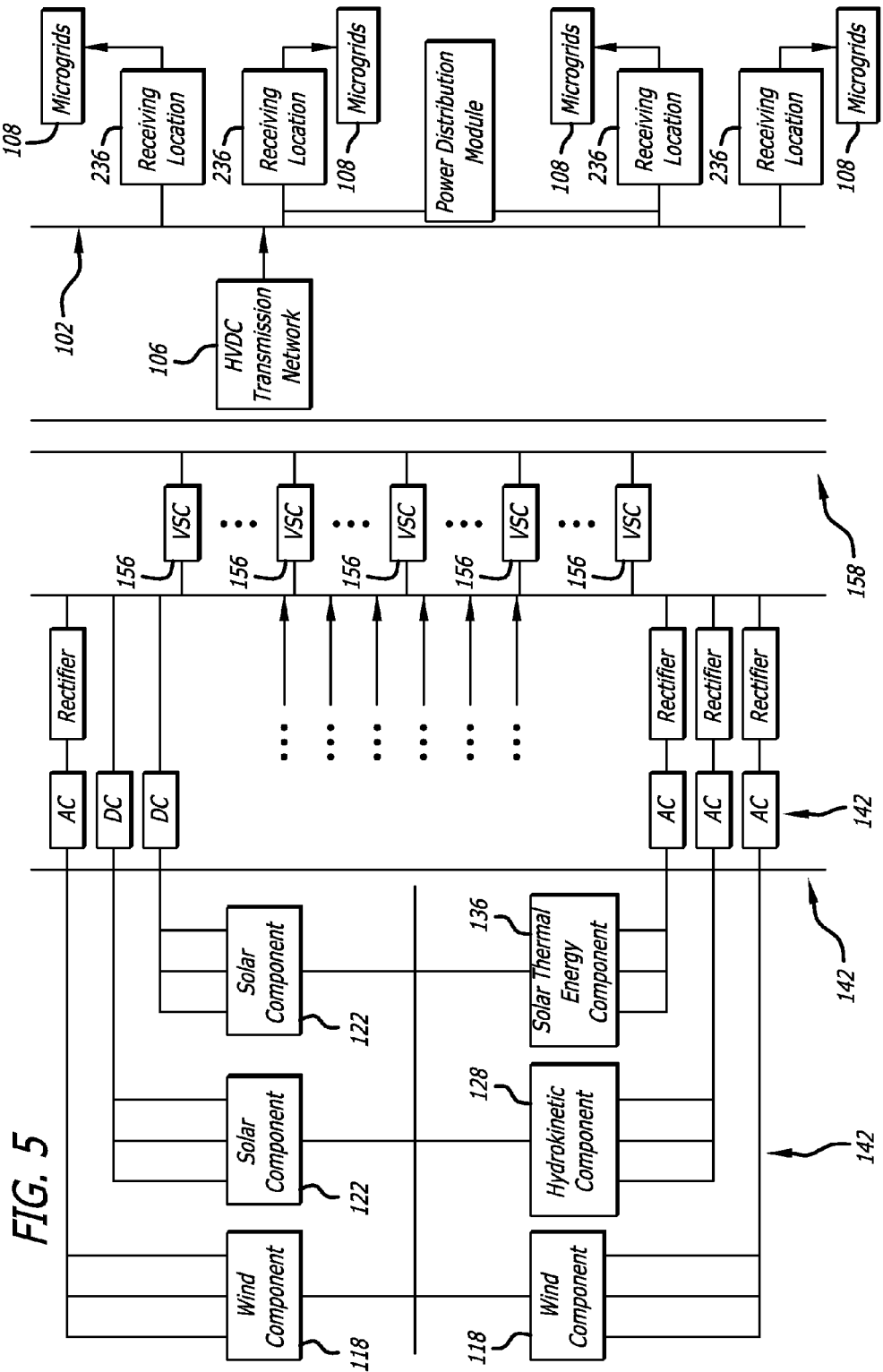
FIG. 5 is a diagram of power output circuits from a multi-resource offshore renewable energy installation connected to a power transmission system according to the present invention.

FIG. 5 is a system diagram of components of a power transmission system in accordance with the various embodiments of the present invention, indicating power outputs of the renewable energy resource components 116 connected to an HVDC transmission system 106, which includes a sub-sea high-voltage direct current link that transfers power generated by the multi-resource offshore renewable energy installation 104 to the intelligent power distribution network 102. Power output circuits 142 feed into a system of one or more voltage source converters 156 that ensure that each renewable energy resource component 116, and each apparatus therein, produces a power output in the proper current at a common or constant voltage level for connection to a common direct current bus 158 connected to the HVDC transmission system 106. All renewable energy resource components 116 and apparatuses of the multi-resource offshore renewable energy installation 104 are directly connected to the system of voltage source converters 156 and the common direct current bus 158 in the HVDC transmission system 206, either in series or in parallel depending on the power output of each, so that a direct current power output is fed into the voltage source converters 156 and the common direct current bus 158 of the HVDC transmission system 106. Where a power output circuit 142 generates AC-based power, it first passes through a rectifier circuit prior to entering a voltage source converter 156 to ensure all electricity entering the common bus 158 is direct current.

The HVDC transmission system 106 also allows each renewable energy resource component 116 to be independently and variably operated because the system of voltage source converters 156, together with any rectifiers needed to convert AC to DC, conduct the necessary power output transformation to ensure consistent and common voltage and current. The HVDC transmission system 106 therefore supports full operational variability of the renewable energy resource components 116 at the multi-resource offshore renewable energy installation 104 to adjust power capacity 148 as needed to satisfy the power requirement 144 relative to all other considerations discussed herein, since designers need not be primarily concerned with the effects of adjusting power capacity 148 on voltage levels.

This design allows for scalability of the multi-resource offshore renewable energy installation 104 to accommodate hundreds and thousands of apparatuses within each component 116. Traditional and existing installations are usually single-resource and are connected to electricity grids either in close proximity thereto and/or under the assumption that because of the small percentage of its relative share of the overall power supply, its size and influence require less stringent attention to connection requirements. However, as electricity grids require more and more power from renewable resources, and multi-resource installations become economically feasible both onshore and at deep sea locations far away from land, the design importance of power electronics considerations increases dramatically.

The voltage source converters 156 allow system designers to reduce the complexity of output circuits 142 of each apparatus of each renewable energy resource component 116, since extra converters in power output circuits 142 are not necessary. This allows for much easier independent and variable operation of apparatuses and devices that produce power from renewable energy resources.

HVDC transmission provides direct current electricity to one or more onshore receiving locations 236 prior to delivery to the intelligent power distribution network 102. The present invention contemplates that electricity can be inverted to AC for those portions of the intelligent power distribution network 102 needing AC, diverted to selected DC-only or DC-specific microgrids 108 or to other DC-only buyers, or transmitted further onward in DC form to other receiving locations of other downstream intelligent power distribution networks 102 for later decision whether to invert to AC or divert for DC-only needs. The framework of the intelligent power distribution network 102, together with the plurality of microgrids 108, supports both AC and DC-based electricity grids and allows power to delivered and consumed in either AC or DC, as needed and instructed by each microgrid 108. DC-only microgrids 108 can therefore receive power directly from the offshore provider without needing to employ a system of rectifiers and inverters.

Because some components can be configured to generate power in DC, a voltage source converter 156 may not be needed with every power output circuit 142 except to regulate any output prior to linking with the common direct current bus 158. Since power output levels may be monitored in conjunction with the transmission control system 230, a bypass circuit may be included to circumvent the VSC system 232 where voltage levels and direct current output are already compatible with requirements of the common direct current bus 158.

The HVDC transmission system 106, in addition to monitoring the voltage source converters 156 and power output circuits 142 of each apparatus to ensure compatible current and voltage levels, may also monitor, together with the transmission control system 220, the power output of each apparatus within each component 116 to determine, as an additional system check, whether an over or under-production of power is being generated for the specific period of time. This adds an additional layer of analysis to ensure a power balance matching power production to power consumption is being achieved, and so that a minimal battery storage requirement at both the multi-resource offshore renewable energy installation 104 and the one or more receiving locations 236 of the intelligent power distribution network 102 is maintained. Where an under-production is detected, the transmission control system 230 is capable of working with specific modules, controllers and with other control systems 212 to increase power production somewhere among the renewable resource components 116. Similarly in the case of a power over-production, power production can be decreased in the same manner.

The present invention also contemplates that one or more feedback loops may be utilized to either transfer power to a temporary battery for storage of the excess power, or to the multi-resource offshore renewable energy installation 104 itself to self-power the installation and its renewable energy resource components 116. In this regard, the HVDC transmission system 106 may act as a source of power for the multi-resource offshore renewable energy installation 104, either directly or from the temporary battery, so that no or very limited additional sources of power are needed to power the installation itself.

Excess power production may also be routed to one or more energy storage facilities that provide backup or alternate sources of power for electricity grids. Such grid-scale batteries may serve one or more broader electricity grids or one or more microgrids 108, and may utilize power over-production from renewable energy resources as an additional layer of power supply in the event of sudden and/or localized variances to the amount of power needed, such as in emergency situations. Where excess power is transferred to grid-scale energy storage facilities, it may be routed thereto from either the multi-resource offshore renewable energy installation 104 upon output signals from the transmission control system 230 or from the intelligent power distribution network 102 at the receiving location 236 or some other component thereof.

Power transmission in the present invention can also be configured so that power is delivered from the multi-resource offshore renewable energy installation 104 to the intelligent power distribution network 102 using wireless systems and methods. One example of wireless energy transfer is through electromagnetic radiation, such as with lasers. Power can be transmitted by converting electricity into laser beams that can be transmitted using a laser emitter to an antenna at one or more receiving locations 236 of the intelligent power distribution network 102. The antenna receives the laser beam and converts the light to direct current-based power to be delivered and routed to microgrids 108 as discussed herein.

The laser beam emitter may be located in a fixed configuration at the multi-resource offshore renewable energy installation 104, or in a temporary configuration that may be deployable as needed. Regardless, it is contemplated that despite possible deep-ocean locations that may result in long distances between the multi-resource offshore renewable energy installation 104 and receiving locations 236, the distance will not result in a substantial loss of power, and laser beam emitters are to be configured to emit laser beams that will not result in a large loss over the distance transmitted.

Where a laser beam-based wireless energy transmission is utilized, the transmission system 106 must account for any power loss that will be encountered with converting power produced at the multi-resource offshore renewable energy installation 104 into a laser beam. Accordingly, power outputs of the renewable energy resource components 116, and the power output circuits 142, may have to be adjusted, either through variable operation of the renewable energy resource components 116 or through the voltage source converters 156.

The type of power transmission can be managed so that the present invention is capable of either by undersea HVDC transmission link, by wireless energy transmission methods as discussed herein, or both. In one embodiment, the transmission control system 230 performs the function of selecting the appropriate transmission method, based on input data from the intelligent power distribution network 102, by the power distribution module 200, power generation module 208, power settlement module 218, or power transmission module 226 of the renewable resource energy management system 100, by the distributed management system 302, or by any another source of such input data. One or more of these or other modules may also be configured to manage the task of determining which method of transmission is to be used.

Use of wireless energy transmission may be utilized where a security or maintenance issue arises with the HVDC transmission system 106. In such situations, wireless energy transmission ensures uninterrupted flow of power from the multi-resource offshore renewable energy installation 104 to the intelligent power distribution network 102 and to the electricity grid infrastructure 300.

FIG. 6 and FIG. 7 are overview perspective and top plan views of the present invention, showing a multi-resource offshore renewable energy installation 104 connected to an intelligent power distribution network 102 via a transmission system 106. FIG. 6 and FIG. 7 show different embodiments of the multi-resource offshore renewable energy installation 104. FIG. 6 shows an embodiment in which multiple floating apparatuses, such as platforms or barges, can produce power from multiple renewable energy components 116 to an intelligent power distribution network 102. FIG. 7 shows another embodiment in which a mobile, semi-submersible production platform provides support for a number of such multiple floating apparatuses. The multi-resource offshore renewable energy installations 104 in FIG. 6 may therefore be coupled in any number to a mobile semi-submersible production platform as shown in FIG. 7. Regardless, it is to be understood that numerous configurations of the present invention are contemplated and possible to achieve the various objectives discussed herein.

The present invention contemplates many other embodiments that are within the scope of this disclosure. For example, in one such embodiment, systems and methods of determining, on one side, an optimal power demand and on the other side, an optimal supply within an electricity grid infrastructure. This includes a method of determining an optimal delivery of power to be generated entirely from renewable resources for an electricity grid infrastructure. Another method according to this embodiment involves determining an optimal generation of power to be delivered to an electricity grid infrastructure. Yet further methods involve settling a transfer of power that is entirely generated from renewable resources and satisfies a power requirement of an electricity grid infrastructure, and transmitting an optimal delivery of power to customers of an electricity grid infrastructure.

In another such embodiment, the present invention discloses a system and method of balancing power production with power consumption in an electricity grid infrastructure. This embodiment includes a method of adapting renewable resource energy production to energy consumption, a method of minimizing storage of electricity for delivery to an electricity grid infrastructure, and a balanced renewable resource-based energy management system comprising a source of power generated entirely from renewable energy resources and a consumer of power having a predictable power demand over any given period of time, wherein the power transmitted satisfies the entire power requirement only from renewable energy resources and at an operational level that maximizes the efficiency of each renewable energy resource.

In yet another embodiment, the present invention discloses a system and method of enhancing grid infrastructure security. This embodiment includes methods of improving electricity grid security and securely delivering power to an electricity grid infrastructure. The embodiment may also include a security system for ensuring delivery of power to an electricity grid infrastructure.

It is to be understood that still other embodiments will be utilized and structural and functional changes will be made without departing from the scope of the present invention. The foregoing descriptions of embodiments of the present invention have been presented for the purposes of illustration and description. It is not intended to be exhaustive or to limit the invention to the precise forms disclosed. Accordingly, many modifications and variations are possible in light of the above teachings. It is therefore intended that the scope of the invention be limited not by this detailed description.

The invention claimed is:

1. A method of virtualizing dynamic demand response in a renewable energy-based electricity grid infrastructure, comprising:

identifying a power requirement over a specified power of time of one or more microgrids among a plurality of microgrids forming an intelligent power distribution network, each microgrid capable of being separately decoupled and separately generating and communicating data defining the power requirement;

aggregating the data defining the power requirement and additional input data for a plurality of mathematical modeling functions from across different portions of a plurality of remote interconnected computing networks in a shared, secure and privately-hosted computing environment forming a distributed computing infrastructure, wherein at least a portion of the additional input data for the plurality of mathematical modeling functions is requested from one or more external computing networks;

analyzing, across the different portions of the plurality of remote interconnected computing networks in the distributed computing infrastructure, the aggregated data defining the power requirement with the additional input data, within the plurality of mathematical modeling functions configured to continuously model a response to the power requirement with at least one of modeling commodity pricing of one or more renewable energy resources, modeling meteorological conditions, modeling power usage patterns of the one or more microgrids, modeling a power production capacity of multiple renewable energy resource components configured on a multi-resource offshore renewable energy installation, and modeling a load capacity of a power transmission system, and to generate one or more resulting data sets relative to the response to the power requirement;

adapting the one or more resulting data sets relative to the response to the power requirement to data representative of real-time conditions within an electricity grid infrastructure communicated by the intelligent power distribution network, the multi-resource offshore renewable energy installation, and the power transmission system to develop a dynamic demand response that includes a production, transmission and distribution of power optimized to real-time conditions within the renewable energy-based electricity grid infrastructure; and delivering the dynamic demand response that includes the production, transmission, and distribution of power from the multiple renewable energy resource components configured on the multi-resource offshore renewable energy installation to the intelligent power distribution network, the distributed computing infrastructure configured to securely communicate, manage, store and process the data defining the power requirement and additional input data for the plurality of mathematical modeling functions so that the mathematical modeling functions are performed across the different portions of the plurality of remote interconnected computing networks to utilize an efficient allocation of available computing resources to minimize weakness points in the renewable energy-based electricity grid infrastructure, to enable real-time scalability and flexibility of a dynamic demand response to the power requirement in response to the real-time conditions, and to facilitate a secure delivery of the dynamic demand response to the power requirement from the multiple renewable energy resource components configured on the multi-resource offshore renewable energy installation to the intelligent power distribution network.

2. The method of claim 1, wherein the delivering the dynamic demand response that includes the production, transmission, and distribution of power further comprises communicating with one or more of the multi-resource offshore renewable energy installation and the power transmission system to deliver the dynamic demand response to the one or more microgrids, the dynamic demand response comprising an instruction to the multi-resource offshore renewable energy installation to produce power for transmission to the intelligent power distribution network and an instruction to the transmission power system to transmit power from the multi-resource offshore renewable energy installation to the intelligent power distribution network.

3. The method of claim 1, wherein the delivering the dynamic demand response that includes the production, transmission, and distribution of power further comprises communicating with one or more of the multi-resource offshore renewable energy installation and the power transmission system to deliver the dynamic demand response to the one or more microgrids, wherein the dynamic demand response is an instruction to the multi-resource offshore renewable energy installation to produce power for transmission to each decoupled microgrid requiring power and an instruction to the power transmission system to separately transmit power to each decoupled microgrid requiring power.

4. The method of claim 1, wherein the identifying a power requirement over a specified power of time of one or more microgrids further comprises receiving data indicative of a request for at least one of a delivery of power to specific decoupled microgrids in the one or more microgrids, a delivery of power in direct current form only to a specific decoupled microgrid, and a delivery of power in at least one specified amount from one or more components in the multiple renewable energy resource components.

5. The method of claim 1, wherein the analyzing the aggregated data defining the power requirement with a plurality of mathematical modeling functions further comprises modeling weather conditions over the specified period of time at a deep-ocean location of the multi-resource offshore renewable energy installation site to predict most favorable weather conditions and least favorable weather conditions for optimal operation of a specific renewable energy resource component, modeling future trends in energy commodity prices over the specified period of time to predict most favorable commodity pricing and least favorable commodity pricing to develop a range of commodity pricing for optimal operation of a specific renewable energy resource component, and modeling the power production capacity of the multiple renewable energy resource components by assessing an operational availability of each specific renewable energy resource component, wherein the renewable energy resource components include at least two of a wind component comprising at least one wind turbine, a photovoltaic component comprising at least one photovoltaic module, a hydrokinetic component comprising at least one of a surface wave turbine, an oscillating column, and an undersea wave turbine, and a solar thermal energy component comprising at least one high-temperature solar thermal collector.

6. The method of claim 1, wherein the analyzing the aggregated data defining the power requirement with a plurality of mathematical modeling functions further comprises modeling the load capacity of the power transmission system by communicating with a transmission control system to monitor a power output circuit of each renewable energy resource component and an output of each voltage source converter in a system of voltage source converters so that a combined power output of the multi-resource offshore renewable energy installation is within the load capacity of a high voltage direct current transmission system to ensure a stable power transmission link between the multi-resource offshore renewable energy installation and the intelligent power distribution network.

7. The method of claim 1, wherein the analyzing the aggregated data defining the power requirement with a plurality of mathematical modeling functions is performed by at least one artificial neural network capable of heuristically modeling the aggregated data.

8. A method of optimizing dynamic demand response in a renewable energy-based electricity grid infrastructure, comprising:

analyzing, across a plurality of remote interconnected computing networks in a shared, secure and privately-hosted computing environment forming a distributed computing infrastructure, aggregated data defining a power requirement over a specific period of time and additional input data relative to a plurality of mathematical modeling functions, the data defining a power requirement communicated by one or more microgrids among a plurality of microgrids forming an intelligent power distribution network, each microgrid capable of being separately decoupled to generate and communicate the power requirement to an energy management system in a renewable energy-based electricity grid infrastructure, the plurality of mathematical modeling functions configured to continuously model a response to the power requirement with at least one of modeling commodity pricing of one or more renewable energy resources, modeling meteorological conditions, modeling power usage patterns of the one or more microgrids, modeling a power production capacity of multiple renewable energy resource components configured on a multi-resource offshore renewable energy installation, and modeling a load capacity of a power transmission system, and to generate one or more resulting data sets relative to the response to the power requirement, wherein the multiple renewable energy resource components include at least two of a wind component comprising at least one wind turbine, a photovoltaic component comprising at least one photovoltaic module, a hydrokinetic component comprising at least one of a surface wave turbine, an oscillating column, and an undersea wave turbine, and a solar thermal energy component comprising at least one high-temperature solar thermal collector;

adapting the one or more resulting data sets to develop, in real time, a dynamic demand response to the power requirement that includes generating and delivering instructions to an offshore multi-resource renewable energy installation and to a power transmission system coupling the multi-resource offshore renewable energy installation to the intelligent power distribution network; and optimizing an efficient power production capacity and an efficient transmission load capacity to deliver the dynamic demand response from the multi-resource offshore renewable energy installation to the intelligent power distribution network by communicating with the multi-resource offshore renewable energy installation the power transmission system to ensure that distributed energy generation from the multiple renewable energy resource components is within a load capacity of the power transmission system.

9. The method of claim 8, wherein the distributed computing infrastructure is configured to securely communicate, manage, store and process the data defining the power requirement and additional input data relative to the plurality of mathematical modeling functions so that the mathematical modeling functions are performed across different portions of the plurality of remote interconnected computing networks to utilize an efficient allocation of available computing resources to minimize weakness points in a renewable energy-based electricity grid infrastructure, to enable real-time scalability and flexibility of a dynamic demand response to the power requirement in response to real-time conditions within the renewable energy-based electricity grid infrastructure, and to facilitate a secure delivery of the dynamic demand response to the power requirement from the multiple renewable energy resource components configured on the multi-resource offshore renewable energy installation to the intelligent power distribution network.

10. The method of claim 8, wherein the optimizing an efficient power production capacity and an efficient transmission load capacity in response to the instructions to deliver the dynamic demand response further comprises instructing the multi-resource offshore renewable energy resource installation to produce an optimal amount of power from the multiple renewable energy resource component and transmit the optimal amount of power to the intelligent power distribution network.

11. The method of claim 8, wherein the optimizing an efficient power production capacity and an efficient transmission load capacity in response to the instructions to deliver the dynamic demand response further comprises instructing the multi-resource offshore renewable energy resource installation to produce an optimal amount of power from the multiple renewable energy resource components and transmit the optimal amount of power to each decoupled microgrid requiring power.

12. The method of claim 8, wherein the analyzing aggregated data defining a power requirement over a specific period of time and additional input data is performed by at least one artificial neural network capable of heuristically analyzing the aggregated data and continuously modeling the response to the power requirement.

13. The method of claim 8, wherein the data defining the power requirement includes a request for at least one of a delivery of power to specific decoupled microgrids in the one or more microgrids, a delivery of power in direct current form only to a specific decoupled microgrid, and a delivery of power in at least one specified amount from one or more components in the multiple renewable energy resource components.

14. The method of claim 8, wherein the analyzing aggregated data defining a power requirement and additional input data relative to the plurality of mathematical modeling functions further comprises:

modeling weather conditions over the specified period of time at a deep-ocean location of the multi-resource offshore renewable energy installation site to predict most favorable weather conditions and least favorable weather conditions for optimal operation of a specific renewable energy resource component, modeling future trends in energy commodity prices over the specified period of time to predict most favorable commodity pricing and least favorable commodity pricing to develop a range of commodity pricing for optimal operation of a specific renewable energy resource component, and modeling the power production capacity of the multiple renewable energy resource components by assessing an operational availability of each specific renewable energy resource component, and modeling the load capacity of the power transmission system by communicating with a transmission control system to monitor a power output circuit of each renewable energy resource component and an output of each voltage source converter in a system of voltage source converters so that a combined power output of the multi-resource offshore renewable energy installation is within the load capacity of a high voltage direct current transmission system.

15. An energy management system configured to perform dynamic demand response in a renewable energy-based electricity grid infrastructure, comprising:
- a shared, secure and privately-hosted computing environment forming a distributed computing infrastructure configured to securely communicate, manage, store and process aggregated data defining a power requirement and additional input data relative to a plurality of mathematical modeling functions across different portions of a plurality of remote interconnected computing networks to utilize an efficient allocation of available computing resources, to minimize weakness points in a renewable energy-based electricity grid infrastructure and enable real-time scalability and flexibility of a dynamic demand response to the power requirement in response to real-time conditions within a renewable energy-based electricity grid infrastructure;
- a plurality of data processing modules resident among the plurality of remote interconnected networks and configured to model a response to the power requirement, the plurality of data processing modules including a grid analytics module configured to perform continuous mathematical modeling of at least one of commodity pricing of one or more renewable energy resources, meteorological conditions, power usage patterns of the one or more microgrids, a power production capacity of multiple renewable energy resource components configured on a multi-resource offshore renewable energy installation, and a load capacity of a power transmission system to generate one or more resulting data sets relative to the response to the power requirement, and an adaptive response module to develop the dynamic demand response to the power requirement from the one or more resulting data sets relative to the response to the power requirement that includes a production, transmission and distribution of power optimized to the real-time conditions within an electricity grid infrastructure communicated by the intelligent power distribution network, the multi-resource offshore renewable energy installation, and the power transmission system; and
- a plurality of instructions embodied in output data communicated by the plurality of data processing modules to optimize an efficient power production capacity and produce power and an efficient transmission load capacity to deliver the dynamic demand response from the multi-resource offshore renewable energy installation to the intelligent power distribution network by producing an optimal amount of power from the multiple renewable energy resource components configured on the multi-resource renewable energy installation and transmit the optimal amount of power to the intelligent power distribution network,
- the shared, secure and privately-hosted computing environment configured to minimize weakness points in the renewable energy-based electricity grid infrastructure and enable real-time scalability and flexibility of the dynamic demand response to the power requirement in response to the real-time conditions.

16. The energy management system of claim 15, wherein the grid analytics module is further configured to perform continuous mathematical modeling of a power production capacity of multiple renewable energy resource components configured on a multi-resource offshore renewable energy installation by modeling weather conditions over the specified period of time at a deep-ocean location of the multi-resource offshore renewable energy installation site to predict most favorable weather conditions and least favorable weather conditions for optimal operation of a specific renewable energy resource component, modeling future trends in energy commodity prices over the specified period of time to predict most favorable commodity pricing and least favorable commodity pricing to develop a range of commodity pricing for optimal operation of a specific renewable energy resource component, and modeling the power production capacity of the multiple renewable energy resource components by assessing an operational availability of each specific renewable energy resource component.

17. The energy management system of claim 15, wherein the grid analytics module is further configured to perform continuous mathematical modeling of a load capacity of a power transmission system by communicating with at least one transmission control system to monitor a power output circuit of each renewable energy resource component and an output of each voltage source converter in a system of voltage source converters so that a combined power output of the multi-resource offshore renewable energy installation is within the load capacity of the high voltage direct current transmission system.

18. The energy management system of claim 15, wherein the data defining the power requirement includes a request for at least one of a delivery of power to specific decoupled microgrids in the one or more microgrids, a delivery of power in direct current form only to a specific decoupled microgrid, and a delivery of power in at least one specified amount from one or more components in the multiple renewable energy resource components.

19. The energy management system of claim 15, wherein the plurality of mathematical modeling functions are performed by at least one artificial neural network capable of heuristically modeling the aggregated data defining the power requirement and the additional input data in the plurality of data processing modules.

20. The energy management system of claim 15, wherein the renewable energy resource components include at least two of a wind component comprising at least one wind turbine, a photovoltaic component comprising at least one photovoltaic module, a hydrokinetic component comprising at least one of a surface wave turbine, an oscillating column, and an undersea wave turbine, and a solar thermal energy component comprising at least one high-temperature solar thermal collector.

* * * * *